(12) United States Patent
Hassler

(10) Patent No.: US 8,164,911 B2
(45) Date of Patent: Apr. 24, 2012

(54) LIGHTWEIGHT ELECTRONIC DEVICE FOR AUTOMOTIVE APPLICATIONS AND METHOD

(75) Inventor: Edgar Glenn Hassler, Sharpsville, IN (US)

(73) Assignee: Delphi Technologies, Inc., Troy, MI (US)

( * ) Notice: Subject to any disclaimer, the term of this patent is extended or adjusted under 35 U.S.C. 154(b) by 564 days.

(21) Appl. No.: 12/370,319

(22) Filed: Feb. 12, 2009

(65) Prior Publication Data

US 2009/0154134 A1 Jun. 18, 2009

Related U.S. Application Data

(63) Continuation-in-part of application No. 11/893,357, filed on Aug. 15, 2007, now Pat. No. 7,733,659.

(60) Provisional application No. 60/838,698, filed on Aug. 18, 2006, provisional application No. 60/931,467, filed on May 23, 2007, provisional application No. 61/066,065, filed on Feb. 15, 2008.

(51) Int. Cl.
*H05K 5/00* (2006.01)

(52) U.S. Cl. ........ 361/752; 361/724; 361/727; 174/392; 181/167; 439/76.1; 439/607.01; 439/620.18; 428/209; 428/432; 347/108

(58) Field of Classification Search .................. 361/752, 361/724, 727; 174/392; 181/167; 439/76.1, 439/607.01, 620.18; 428/209, 432; 347/108
See application file for complete search history.

(56) References Cited

U.S. PATENT DOCUMENTS

| | | | |
|---|---|---|---|
| 5,045,971 A | 9/1991 | Ono et al. | |
| 5,406,038 A * | 4/1995 | Reiff et al. | 181/167 |
| 5,467,947 A | 11/1995 | Quilling, II | |
| 5,814,761 A | 9/1998 | Piazza | |
| 6,238,247 B1 * | 5/2001 | Belopolsky et al. | 439/620.18 |
| 6,709,291 B1 * | 3/2004 | Wallace et al. | 439/607.01 |
| 2003/0112315 A1 * | 6/2003 | Hetzer et al. | 347/108 |
| 2004/0051670 A1 * | 3/2004 | Sato | 343/702 |
| 2004/0248436 A1 * | 12/2004 | Abe et al. | 439/76.1 |
| 2005/0003685 A1 * | 1/2005 | Abe et al. | 439/76.1 |
| 2005/0042900 A1 * | 2/2005 | Abe et al. | 439/76.1 |
| 2007/0068366 A1 | 3/2007 | Hamaoka et al. | |
| 2007/0182298 A1 * | 8/2007 | Kubota et al. | 313/110 |
| 2008/0245563 A1 * | 10/2008 | Naito et al. | 174/392 |
| 2009/0029125 A1 * | 1/2009 | Nakahira | 428/209 |

OTHER PUBLICATIONS

International Search Report dated Jul. 14, 2009.

* cited by examiner

*Primary Examiner* — Xiaoliang Chen
(74) *Attorney, Agent, or Firm* — J. Gordon Lewis

(57) ABSTRACT

A lightweight radio/CD player for vehicular application is virtually "fastenerless" and includes a case and frontal interface formed of polymer based material that is molded to provide details to accept audio devices such as playback mechanisms (if desired) and radio receivers, as well as the circuit boards required for electrical control and display. The case and frontal interface are of composite structure, including an insert molded electrically conductive wire mesh screen that has been pre-formed to contour with the molding operation. The wire mesh provides EMC, RFI, BCI and ESD shielding and grounding of the circuit boards via exposed wire mesh pads and adjacent ground clips. The major components and subassemblies self-interconnect by integral guide and connection features effecting "slide lock" and "snap lock" self-interconnection. The major components and subassemblies self-ground by establishing an interference fit with exposed, resilient, embossed portions of wire mesh.

19 Claims, 28 Drawing Sheets

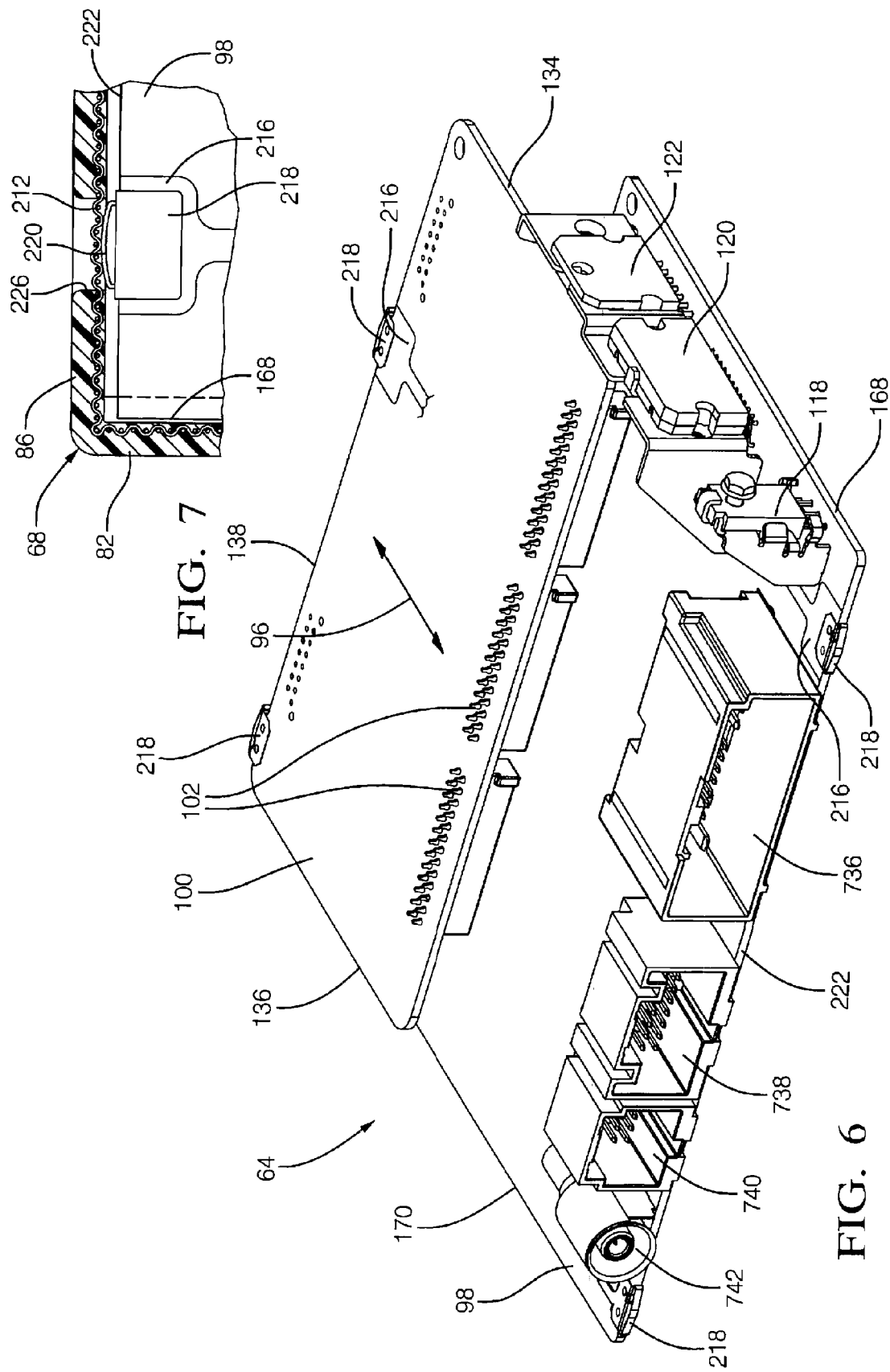

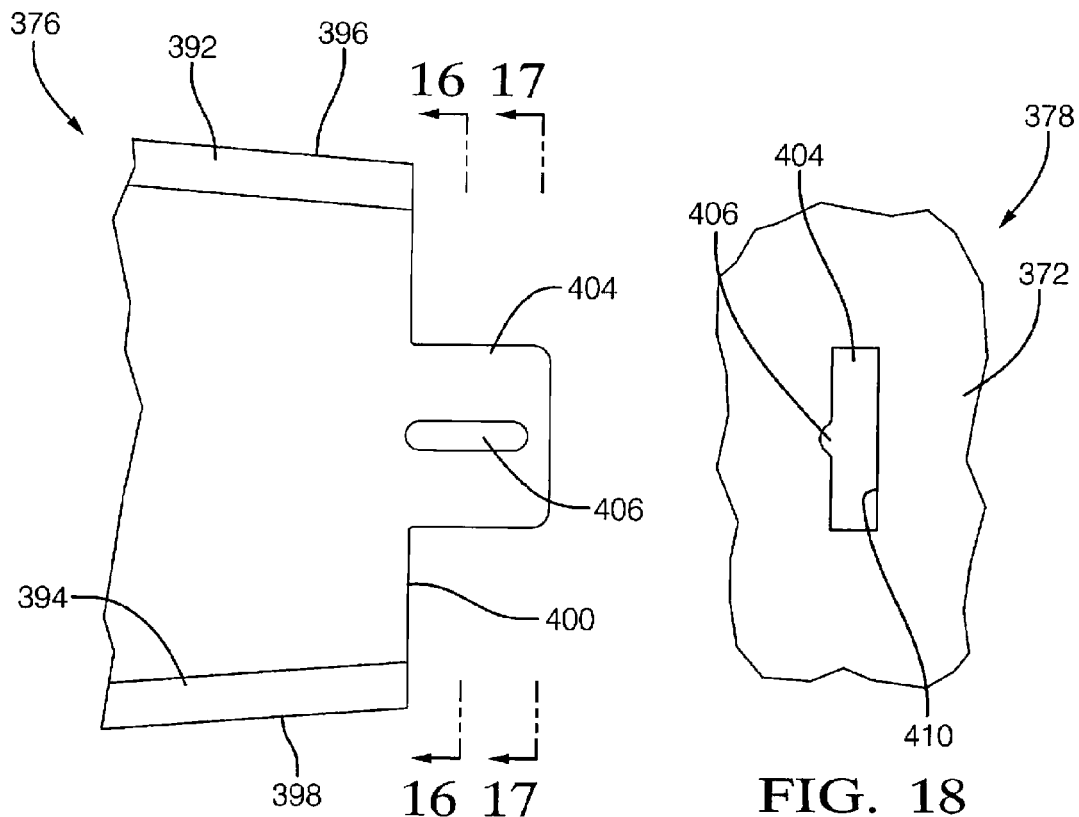
FIG. 15
FIG. 18
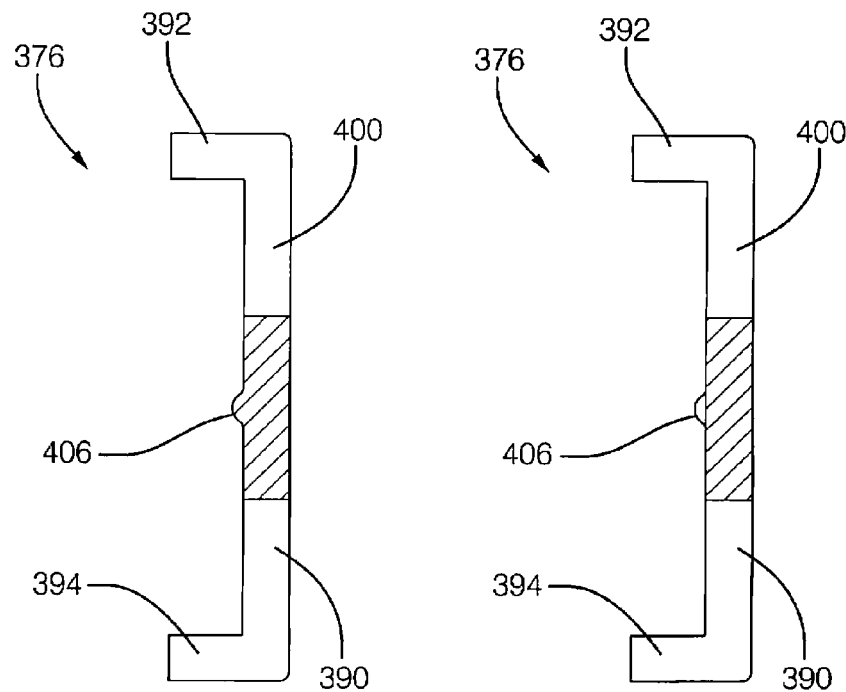
FIG. 16
FIG. 17

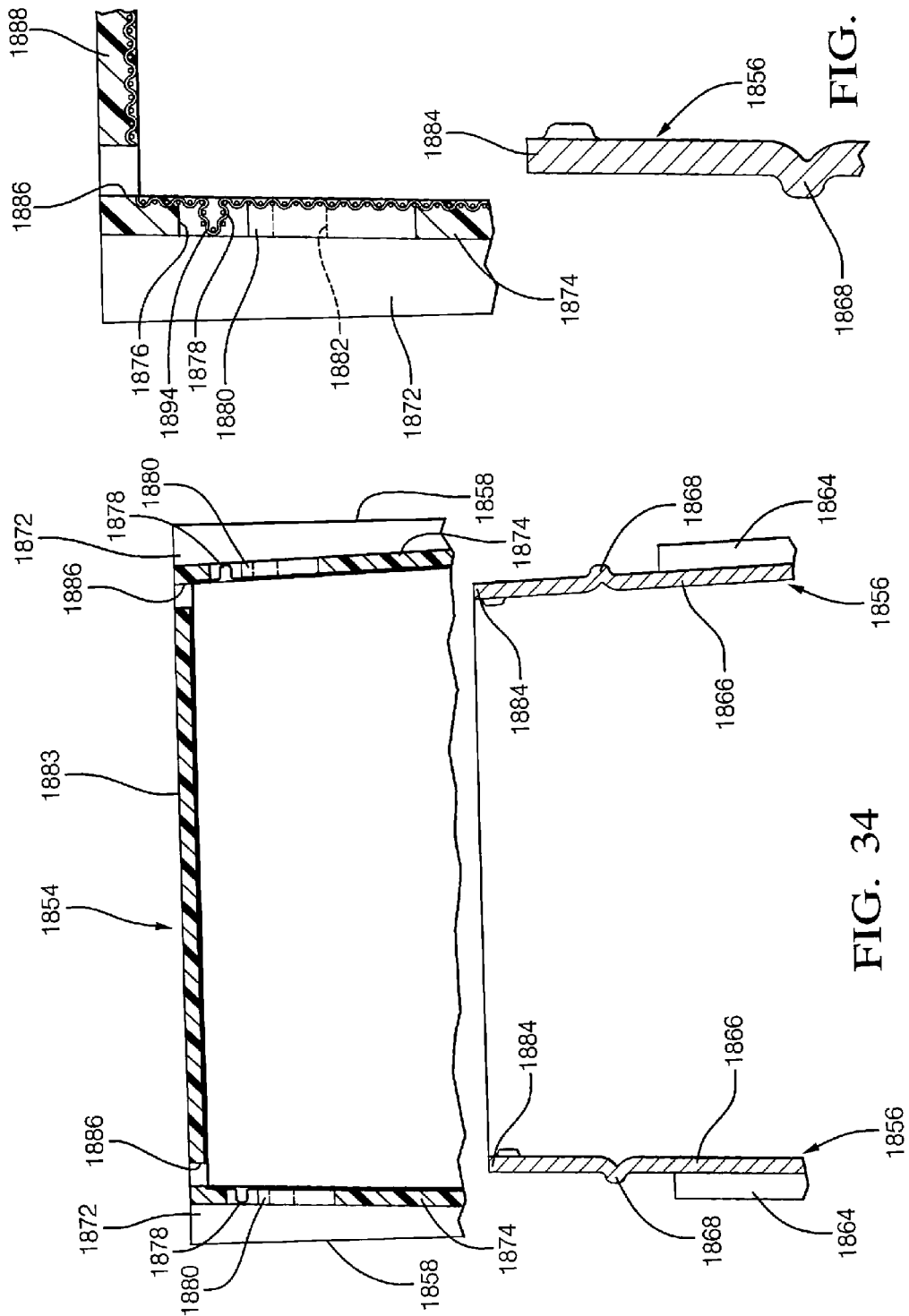

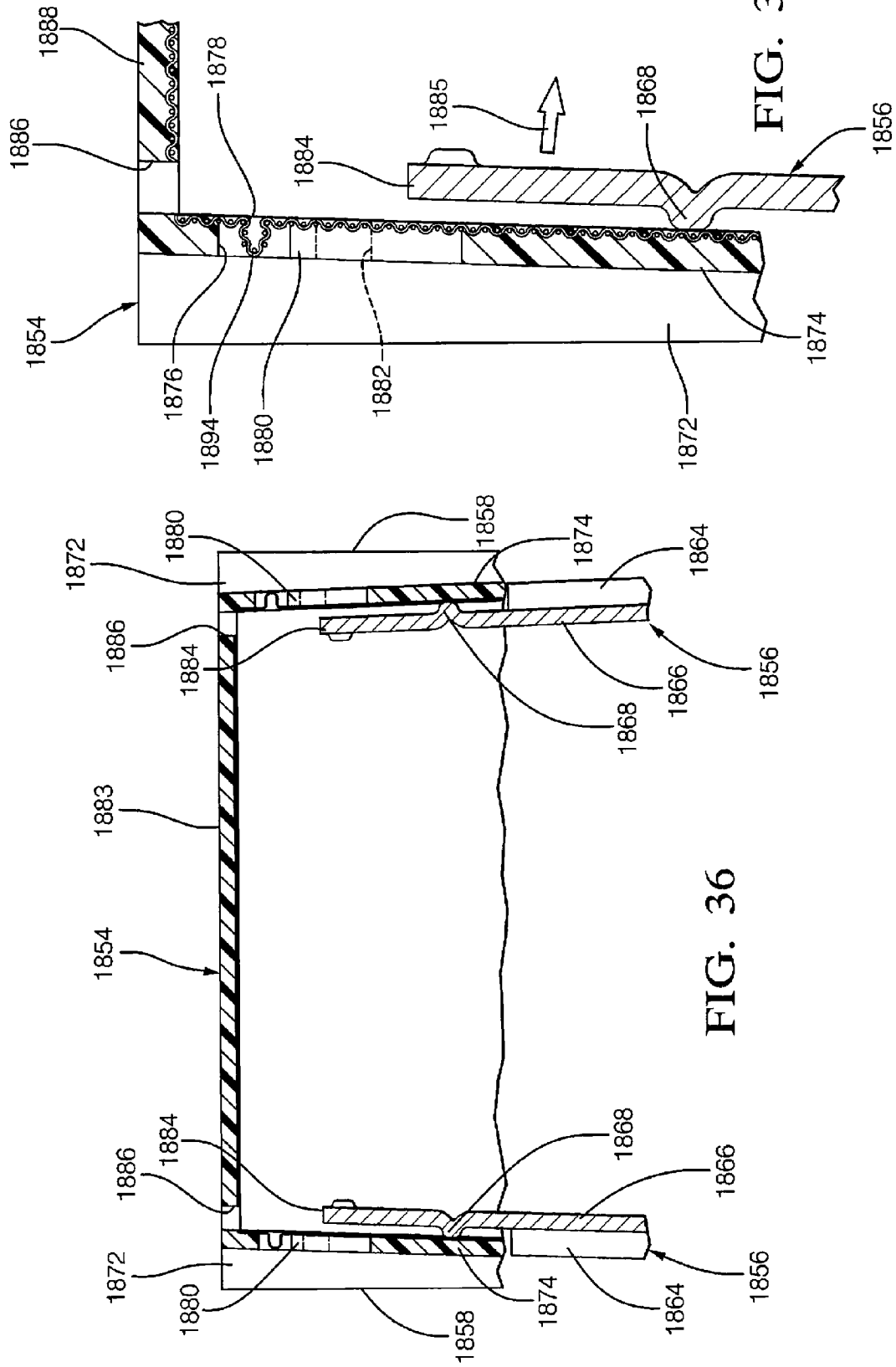

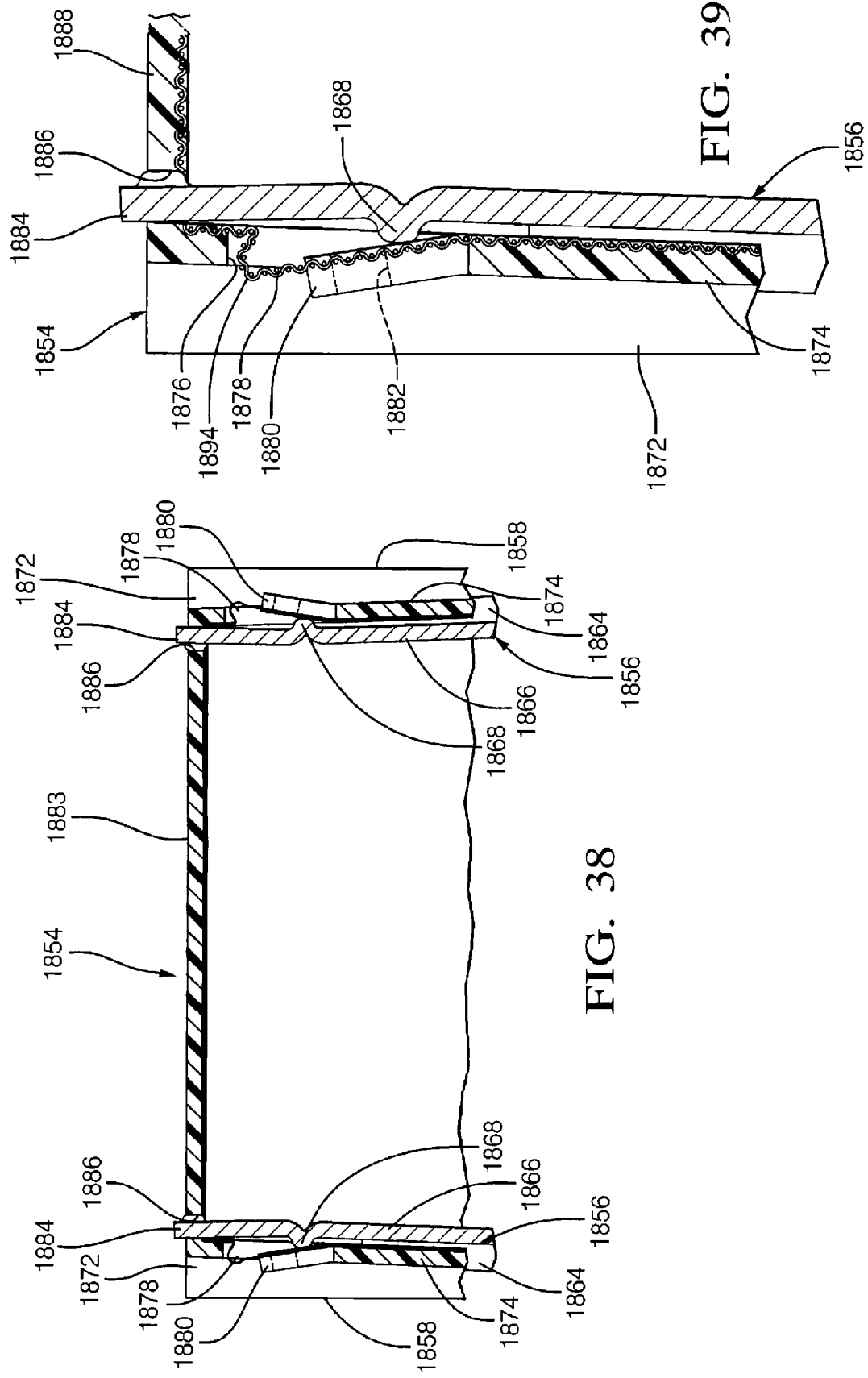

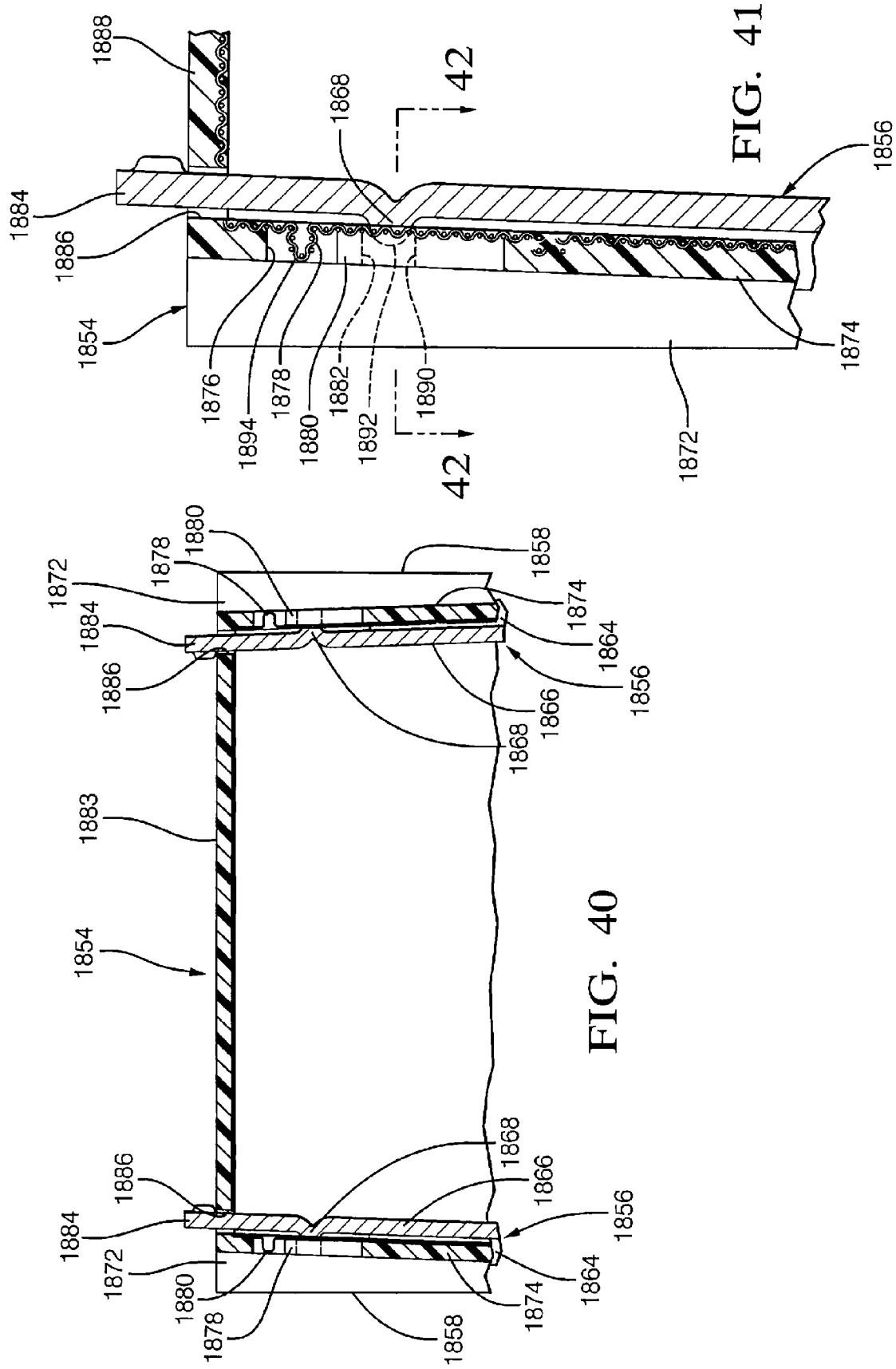

| PRODUCT DATA SHEET | ISSUE DATE: 02/08/07 |
| --- | --- |
| 30 X 30, .007 | REVISION: 1 |
| ANNEALED, CALENDERED, GALVANIZED ONLY | PAGE: 1 of 1 |
| STEEL | |

| PHYSICAL PROPERTIES: | English | Metric |
| --- | --- | --- |
| * Mesh Count, Warp | 30 per inch +/- 1.0 | 59.0 per 5 cm +/- 0.5 |
| Fill | 30 per inch +/- 1.0 | 59.0 per 5 cm +/- 2.0 |
| * Weight | 10.3 +/- 10% (lb./100ft$^2$) | .440 +/- 10% (Kg/m$^2$) |
| * Slit Width Tolerance | +/- 0.015 inches | +/- 0.381 mm |
| * Length Tolerance | + 12/- 0 inches | + 30.5/- 0 cm |
| Roll Length Tolerance | Min. 450ft. / Max. 550ft. | Min. 137.2m / Max. 167.6m |
| No. Pieces per Roll Acceptable: | 2 | |
| Weave | Plain (Double Crimped) | |
| Selvage | Slit | |
| Finished, Coated | Annealed Galvanized Only, Calendered | |
| Put-Up: | 3.0 inch (7.62 cm) Tube, Shipped Palletized | |

QUALITY STANDARD:
Special Requirements:

Out of Square Tolerance: Max. 15 wires/ft.
Meets the grading criteria for industrial screen applications as described by
ANSI/AWCI-01-1992, Section 4.4

Calendered Crimp Tolerance - 0.0095" +/- 0.0005"

PRODUCTS:

FIG. 49

LIGHTWEIGHT ELECTRONIC DEVICE FOR AUTOMOTIVE APPLICATIONS AND METHOD

RELATED APPLICATIONS

The present application is a continuation-in-part of U.S. Ser. No. 11/893,357, filed Aug. 15, 2007, now U.S. Pat. No. 7,733,659 B2 issued 8 Jun. 2010, entitled "LIGHTWEIGHT AUDIO SYSTEM FOR AUTOMOTIVE APPLICATIONS AND METHOD", which claims the benefit of U.S. Ser. No. 60/838,698 filed Aug. 18, 2006 and U.S. Ser. No. 60/931,467, filed May 23, 2007, which are assigned to a common assignee. The instant application also claims the benefit of U.S. Ser .No. 61/066,065, filed Feb. 15, 2008, entitled 'LIGHTWEIGHT ELECTRONIC DEVICE FOR AUTOMOTIVE APPLICATIONS AND METHOD. The teaching and specifications of the forgoing related applications are incorporated herein by reference.

TECHNICAL FIELD

The present invention relates generally to apparatus for enclosing electrical subassemblies, and more specifically relates to apparatus for efficiently securing subassemblies to a chassis of an electrical assembly such as an automobile radio, compact disc playing mechanism, cassette tape playing mechanism, navigational aid, personal computer, personal and telematic communication devices or disk drive mechanism.

BACKGROUND OF THE INVENTION

Devices such as automobile radios or personal computers contain subassemblies such as cassette playing mechanisms or disk drives that are attached to the chassis using threaded fasteners. The chassis provides structural support for the subassemblies and also provides electromagnetic shielding to limit electromagnetic interference (EMI) experienced by, and/or created by the device. The fasteners ensure that each subassembly within the chassis is properly located and securely retained within the chassis.

The use of such fasteners can have numerous drawbacks, particularly in a high volume production setting. The process for applying or installing fasteners can vary, but there is usually some degree of automation required, ranging from manually loading a screw into a bit on a pneumatic driver to using self-feeding automated machines. Typically, the torque applied by the device used to drive the fasteners must be monitored regularly and adjusted in order to assure proper seating of the fasteners. When fasteners are used, sheet metal tolerances, as well as tolerances of the fasteners themselves, have to be maintained at tight levels to allow for the minimization of stress in the assembly when aligning multiple fasteners with corresponding holes in the chassis and in the subassembly.

When threaded fasteners are used to assemble an electrical device, the assembly cycle time can be very long especially in high volume production. An operator assembling the device must typically first obtain the threaded fastener, orient and position it in alignment with the driver bit, then manipulate or actuate the machine to drive the threaded fastener. Furthermore, using threaded fasteners presents a risk of any one of the following upstream failures occurring: stripping of fastener threads; insufficient torque resulting in an unseated fastener; excessive torque resulting in distension/deformation of the fastener or adjacent electrical components; installation of the wrong fastener type or size; foreign object damage due to fasteners and/or metal shavings dropping onto the assembly and/or subassembly; and stripping of the head of the threaded fastener. Also, a fastener installation tool such as a driver and bit can slip off the fastener and impact an electrical component resulting in a damaged assembly.

If self-tapping fasteners are used, the process of driving the self-tapping fasteners into sheet metal often causes shavings of sheet metal to disperse into the assembly. Such shavings have been known to cause electrical failures, such as shorts or corruption of magnetic components that can permanently damage the product. If self-tapping fasteners are not used, an extra production step is required to pre-form threads in the sheet metal of the chassis and/or the subassembly to be installed within the chassis.

Fasteners further require an additional inventory burden on the production line in that the production line must be continuously stocked with part numbers (fasteners) other than the integral components that add value to the assembly. Also special tools specifically required for assembly, using fasteners, such as drivers and bits, must be continuously monitored and maintained for proper performance, wear and torque specifications. Typically, the top and/or bottom surface of the chassis must be secured in place after the subassembly is attached to the chassis.

Special fixtures are often required on the production line to secure a subassembly in a proper location and orientation while it is mounted within the chassis with fasteners. Such fixtures can be very complex, and the use of such fixtures usually requires extra handling of both the subassembly and of the resulting assembly thereby adding to the production cycle time and potentially compromising quality of the final product.

FIG. 1 illustrates the construction of a typical prior art automotive radio/compact disc (CD) player 10. Radio/CD player 10 comprises a radio subassembly whose principle circuit components are carried on a circuit board 12 and a CD player subassembly 14. The circuit board 12 and the CD player 14 are encased within a common chassis 16 made up of sheet metal components. Chassis 16 includes a wraparound housing 18 defining a back and sidewalls, a top cover 20, a bottom cover 22 and a front plate 24 which are interconnected by numerous threaded fasteners to collectively enclose the subassemblies. The top and bottom covers 20 and 22, respectively, are provided with large arrays holes or openings for airflow and ventilation of heat generated within the radio/CD player 10. A convector or heat sink 26 is carried on an outer surface of one of the chassis sidewalls and is interconnected through a port/window 28 to a power device assembly 30. A trim plate assembly 32, along with a support pad 34 and CD dust cover 36 are affixed to the front plate 24, providing an operator control interface with the radio/CD player 10. Circuit board 12 is electrically in-circuit with the CD player subassembly 14 through an intermediate flex wire cable 38 and with the power device assembly 30 through a jumper cable 40. Information bearing labels 42 and 44 are provided for future reference by the operator and service technicians. The radio/CD player 10 is electrically interconnected with an antenna, power supply, speakers and other related systems of a host vehicle by rear-facing connectors 46 carried on the circuit board 12 which are registered with openings 48 in the rear wall of wraparound housing 18. The radio/CD player 10 is mounted within a host vehicle by threaded fasteners passing through openings in mounting features 50 extending from front plate 24 and a rearwardly directed mounting bushing 52 which is threadably affixed to a stud 54 carried on the outer surface of the rear wall 56 of wraparound housing 18. As best seen in FIGS. 11 and 12, the shank of the stud 54 extends outwardly through a hole 58 disposed concentrically with a localized recess 60 and the stud 54 is seated within the recess 60. FIG. 90 illustrates another known stud design including a threaded shank secured to the rear wall 53 of a radio set 51 by a set nut 55 and receiving a molded rubber, plastic or vinyl stud 57 thereover. Note the large number of threaded fasteners 59.

The radio/CD player 10 of FIG. 1 is of ordinary complexity and may require fifty or more threaded fasteners to complete the manufacturing process. Installation of that many fasteners may require that the in-process chassis be re-positioned/re-fixtured ten to fifteen times as it passes along an assembly line of eight to ten skilled workers/work stations.

Vehicle entertainment systems usually include an audio component such as a radio to enable receiving signals from antennas, contain various forms of playback mechanisms, and have the capacity to accept data from user devices like MP3 players. Typically, the radio has a decorative assembly that provides man-machine interface as well as displaying pertinent data relative to the selected media and audio settings. Also, the back-end or chassis is constructed of metal to provide various functions to ensure the performance of the radio in the vehicular environment. The structure to contain the mass from playbacks, the heat conductive properties, and the electrical shielding and grounding are just a few of the advantages to using the metal construction. Unfortunately, with the density of the metal, the disadvantage of added weight is a side effect of the typical construction. In a vehicle, added weight impacts fuel economy, as well as other hidden costs during assembly that can effect the cost of the product, like sharp edges of metal can be a potential hazard for assemblers in the manufacturing plant as well as added weight can limit the packaging of multiple parts in containers for inter and outer plant distribution.

Special fixturing is often required to hold a component in the proper location while it is mounted to the convector using one or more fasteners. Such fixturing can be very complex and use of such fixturing usually requires extra handling of both the component and of the resulting assembly, thereby adding to the production cycle time and potentially compromising quality of the final product.

When threaded fasteners are used, the assembly cycle time can be very long, especially in high volume production. The operator must specifically obtain the threaded fastener, bring it in contact with the driver bit, then drive the threaded fastened. If self-tapping fasteners are used, the process of driving the self-tapping fasteners into metal often causes metal shavings to disperse into the assembly. Such shavings have been known to cause electrical failures that can permanently damage the product. If self-tapping fasteners are not used, an extra production step is necessary to form threads in the metal of the convector.

Accordingly, there is a need for electrical assemblies that do not require fasteners or tooling for securing a component to a convector.

SUMMARY OF THE INVENTION

The present invention provides numerous product and process advantages which collectively result in substantial cost and labor savings. By way of example, the preferred design optimizes the assembly process. It minimizes the required handling of major components and subassemblies during the assembly cycle. Final assembly is optimized, wherein only seven major components and subassemblies are involved. This minimizes the number of work stations and fixtures, in-process transfers between work stations and total assembly cycle time. The inventive design permits selection of the optimal mechanical product configuration for a given receiver family. Furthermore, it permits idealized electrical and mechanical building block partitioning for common and unique elements.

The preferred embodiment of the invention contemplates screwless final assembly without the use of tools, fixtures and assembly machines. This greatly enhances in-process product flow in the factory, improves scheduling of final assembly, and allows labor intensive processes such as stick lead assembly to be largely moved off-line. This greatly reduces both direct and indirect labor requirements. Furthermore, inventory control is simplified inasmuch as position part proliferation is deferred to or near the end of process.

These and other features and advantages of this invention will become apparent upon reading the following specification, which, along with the drawings, describes preferred and alternative embodiments of the invention in detail.

BRIEF DESCRIPTION OF THE DRAWINGS

The present invention will now be described, by way of example, with reference to the accompanying drawings, in which:

FIG. 6, is a perspective view of the circuit board assembly with ground clips installed thereon;

FIG. 7, is a fragmentary, cross-sectional view of a ground clip and an associated portion of the printed circuit board on an enlarged scale in assembly with an adjacent portion of the case to effect a grounding point with the integral wire mesh;

FIG. 15, is a fragmentary detail, on an enlarged scale, of the rear end portion retention tab of the CD mechanism bracket depicted in FIGS. 12-14;

FIG. 16, is a cross-sectional view of a first portion of the retention tab of the CD mechanism bracket taken on lines 16-16 of FIG. 15 illustrating an integral dimply/crush rib formed therein;

FIG. 17, is a cross-sectional view of another portion of the retention tab of the CD mechanism bracket taken on lines 17-17 of FIG. 15;

FIG. 18, is an end plan view of the retention tab of the CD mechanism bracket in its assembled position within the rear wall portion of the case of the radio/CD player as depicted in FIG. 14;

FIG. 34, is a fragmentary, exploded, top cross-sectional view of the exemplary automotive audio system composite case of FIG. 33, juxtaposed for installation of a cooperating pair of (CD player) subassembly mounting brackets therein, prior to contact between the bracket and case;

FIG. 35, is a fragmentary, exploded, cross-sectional view of a portion of the case and one of the mounting brackets of FIG. 34 on an enlarged scale;

FIG. 36, is a fragmentary, exploded, top cross-sectional view of the exemplary automotive audio system composite case of FIG. 33, juxtaposed for installation of a cooperating pair of (CD player) subassembly mounting brackets therein, at a point of initial contact between the bracket and case;

FIG. 37, is a fragmentary, exploded, cross-sectional view of a portion of the case and one of the mounting brackets of FIG. 36 on an enlarged scale;

FIG. 38, is a fragmentary, exploded, top cross-sectional view of the exemplary automotive audio system composite case of FIG. 33, juxtaposed for installation of a cooperating pair of (CD player) subassembly mounting brackets therein, at a point of contact between the bracket and case affecting maximum lateral displacement of integral case mounting tabs, prior to their locking engagement with a mounting feature of the adjacent subassembly mounting bracket illustrating the momentary distention of the upset bead firmed in the exposed conductive material (screen mesh);

FIG. 39, is a fragmentary, exploded, cross-sectional view of a portion of the case and one of the mounting brackets of FIG. 38 on an enlarged scale;

FIG. 40, is a fragmentary, exploded, top cross-sectional view of the exemplary automotive audio system composite case of FIG. 33, juxtaposed for installation of a cooperating pair of (CD player) subassembly mounting brackets therein, wherein the bracket and case are fully assembled and the integral case mounting tabs have resiliently returned to their nominal rest positions affecting locking engagement with a mounting feature of the adjacent subassembly mounting bracket;

FIG. 41, is a fragmentary, exploded, cross-sectional view of a portion of the case and one of the mounting brackets of FIG. 40 on an enlarged scale;

FIG. 49, is a Product Data Sheet of steel mesh employed by the applicant in certain embodiments of the composite case of the present invention.

Figure 1:
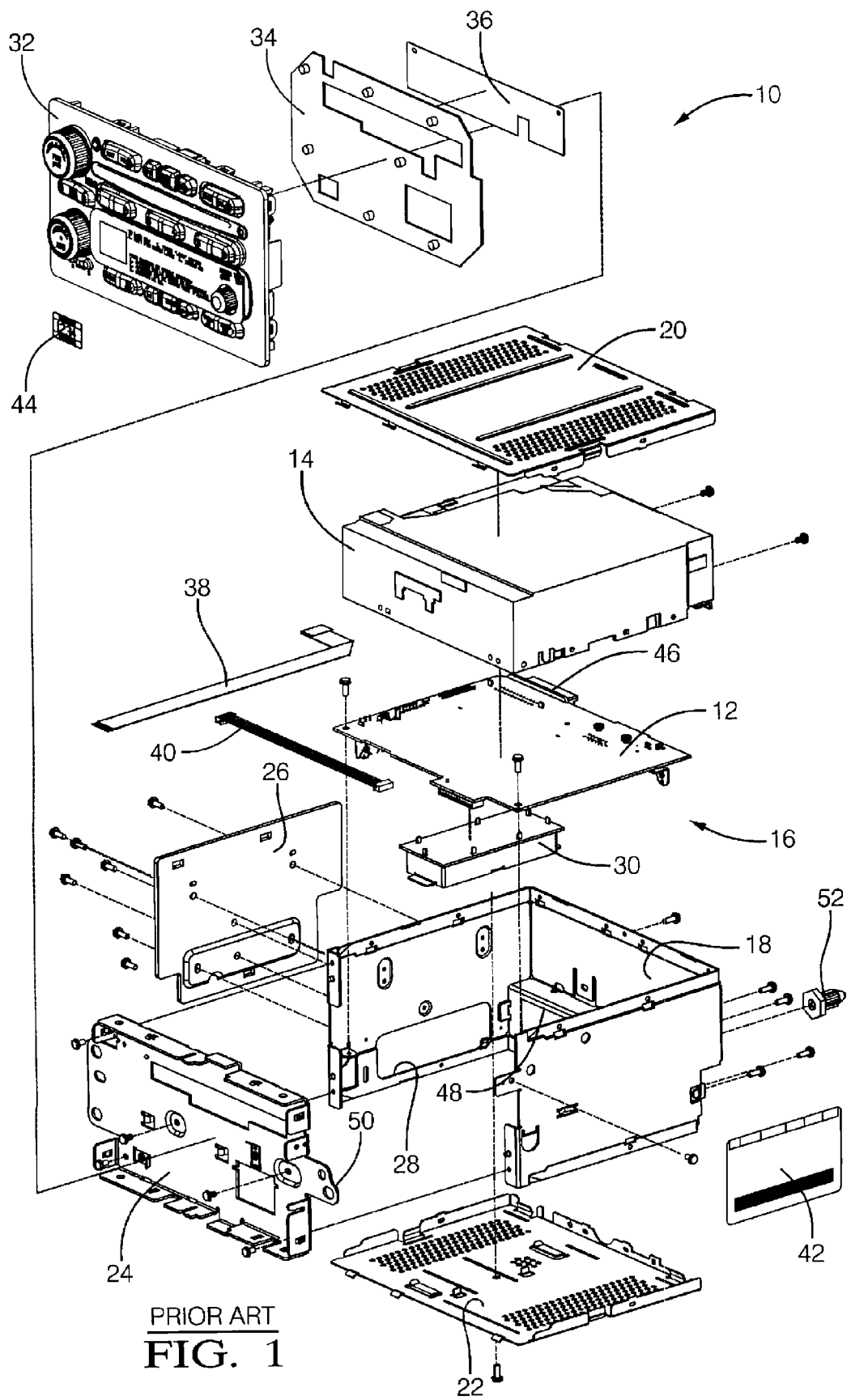
FIG. 1, is an exploded, perspective view of a prior art automotive radio/CD player combination in a common chassis constructed of sheet metal and a large number of threaded fasteners.

Although the drawings represent varied embodiments and features of the present invention, the drawings are not necessarily to scale and certain features may be exaggerated in order to illustrate and explain the present invention. The exemplification set forth herein illustrates several aspects of the invention, in one form, and such exemplification is not to be construed as limiting the scope of the invention in any manner.

DESCRIPTION OF THE ILLUSTRATIVE EMBODIMENTS

The present invention can be applied in its broadest sense to electronic devices and systems where shielding from radio frequency interference (RFI), electromagnetic interference (EMI), bulk current injection (BCI) and/or electrostatic discharge (ESD) is required. In addition to vehicle based radios and audio entertainment systems, the invention can be advantageously applied in "infotainment" and telematic systems. Furthermore, the present invention employs virtually "fastenerless" design architecture to facilitate low-cost, high volume production techniques.

For convenience of understanding, the following description will be focused primarily upon an automotive radio/CD player system.

The present invention reflects an improved design to reduce the overall weight of an automotive radio/CD player without compromising the strength of the unit. The present invention employs a polymer based, electrically insulative material that can be molded to provide the necessary features for the chassis as well as the frontal interface to the decorative front-end assembly described for the man-machine interface. By molding a case with the necessary details to accept the playback mechanisms (if desired) as well as the circuit board(s) needed for the electrical control, the required functionality of the unit is maintained as compared to the typical metal box. The necessary shielding and grounding is accomplished by insert-molding electrically conductive sheet-like material such as a mesh screen wire that has been pre-formed to contour with the molding operation. The grounding of the circuit boards may be accomplished by using ground clips attached directly to the ground pads of the circuit board that would interface directly with exposed screen wire mesh of the molded part. While metal is also a good conductor for the thermal load inside the unit, openings must be incorporated to allow airflow for additional cooling. The same openings can compromise the shielding. With in-molded mesh screen wire, the mesh acts as a Faraday cage to shield the electronics, but the open weave allows airflow to promote the dissipation of the thermal load from inside the unit, to the exterior. Besides the reduction of mass offered by the molded polymer material for the unit chassis and front plate, the hidden benefits include ease of handling in the assembly process as well as less container and shipping weight.

To facilitate assembly, the molded polymer chassis and front plate can use integral or molded in guideways and snaps, thereby eliminating the typical screw fastener assembly method previously used for these components. To enhance the rigidity, the component parts that comprise the assembly are sandwiched at the common vehicle instrument panel attachment points such that when the mounting screws are driven, they firmly clamp the component pieces to the host vehicle. In the event a playback mechanism of substantial mass and volume is required, the sub-assembly structure for the mechanism would utilize formed attachment tabs that would be an intermediate layer in the aforementioned component part sandwich. Another benefit for the mounting at the back of the radio is often vehicles have a receptive hole or slot in the inner cavity of the instrument panel carrier that accepts a mounting bushing or "bullet" shaped extension that is screwed to a mounting stud that is typically swaged to the back of the metal enclosure of the radio. The mounting "bullet" can be molded directly in the polymer-based case eliminating the additional part and the assembly of that additional part.

To replace the metal structure of the vehicle radio, a galvanized (or appropriately coated) steel mesh wire screen will be cut, formed, and molded with a polymer resin to provide necessary details for assembly of components required for the functionality of the radio including, but not limited to, a circuit board assembly, a heat sink for audio power and switching components, a playback mechanism, and a man-machine interface or trim plate assembly, as well as vehicle mounting features. While the polymer or plastic provides the majority of the mechanical structure for the radio, the in-molded mesh screen wire provides the needed protection from various electrical anomalies including electromagnetic contamination, radio frequency interference, bulk current injection, and electrostatic discharge, to name a few. The screen mesh also allows openings necessary for air passage or venting of heat from the radio by molding the radio back end or case and front plate. The many details and features needed in a typical assembly can be incorporated directly into the parts, eliminating the need for fasteners and separate additional parts often required with parts fabricated in metal.

The specific materials selected for fabricating the radio case and front plate will vary depending upon the application, including the contained mass of the mechanisms employed as well as the severity of the contemplated environment (esp. temperature and vibration). Examples of materials that could be employed for typical automotive applications are:

Case: Glass-filled polyester, Glass-filled polypropylene, Polycarbonate, ABS.

Front Plate Polycarbonate, ABS, PC/ABS and Noryl.

Major components which contact one another or are mechanically interconnected preferably are formed from material having substantially differing surface finish and hardness characteristics to minimize the possibility of resulting squeaks, rattles and the like.

Although presently viewed as cost prohibitive for automotive applications, it is contemplated that nano carbon tube filler can be employed within the plastic material forming the case and front plate to provide effective shielding and enhance the structural strength of the case assembly.

In addition to weight savings, which may amount to well over one pound (0.4536 Kg), the part handling is improved to reduce the amount of fasteners as well as separate component parts. Often a radio may be constructed from a wrap-around, a cover and the fasteners along with a mounting bushing or "bullet" screwed to a "swaged" threaded stud in the metal case. Also, the metal pieces require assembly personnel to wear gloves during handling to avoid any cuts or damage to their hands as well as protection from any metal fabrication fluid residue. Molded plastic does not require any special gloves, or the concerns of cuts to the skin. Aside to the benefit to the vehicle by reducing the radio weight by over one pound (0.4536 Kg), the savings for a manufacturer include reduced shipping cost through the weight reduction and potential container efficiency improvements. Product labeling can be improved through laser engraving the plastic with the desired number, customer logos, etc. Metal typically requires a stamping detail (not easily changed) and/or a printed label that is adhesively applied. This offers greater flexibility and eliminates additional parts (like labels) to use the plastic, as well as better durability than a label.

Referring to FIGS. 2-5, a consolidated radio/CD player apparatus 62 embodying many aspects of the present invention is illustrated. The radio/CD player 62 is an assemblage of six major components or subassemblies, a circuit board subassembly 64, a CD player subassembly 66, a box-like housing case 68, a front closure member or front plate 70, a convector or heat sink 72 and a trim plate subassembly 74.

It is envisioned that each of the major components/subassemblies would be produced "off-line" and the final assembly process would comprise the efficient, high volume joining of the major components/subassemblies and end-of-line testing of the completed units.

Figure 2:
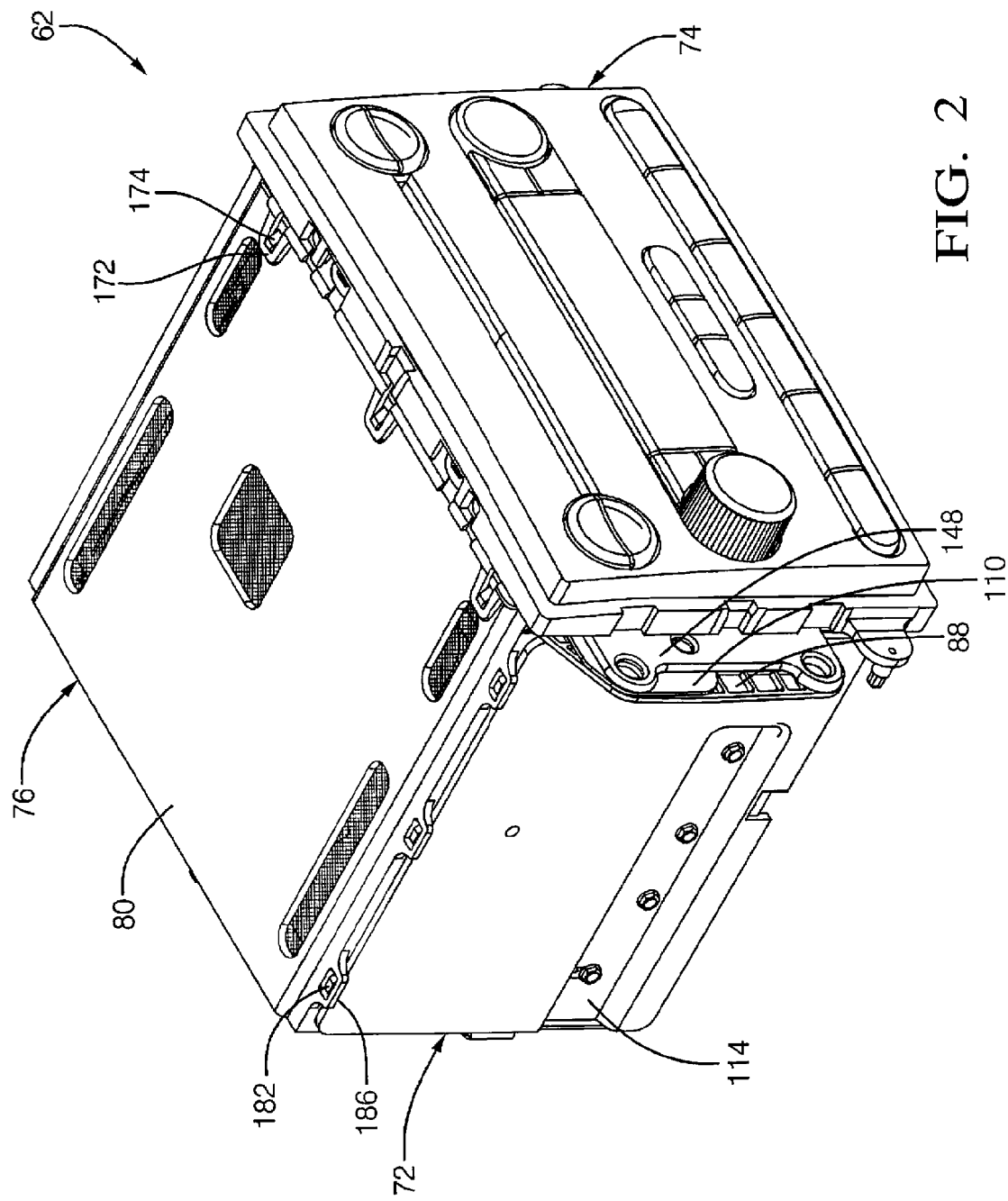
FIG. 2, is a front-left perspective view of the preferred embodiment of the present invention embodied in an automotive radio/CD player.
Figure 3:
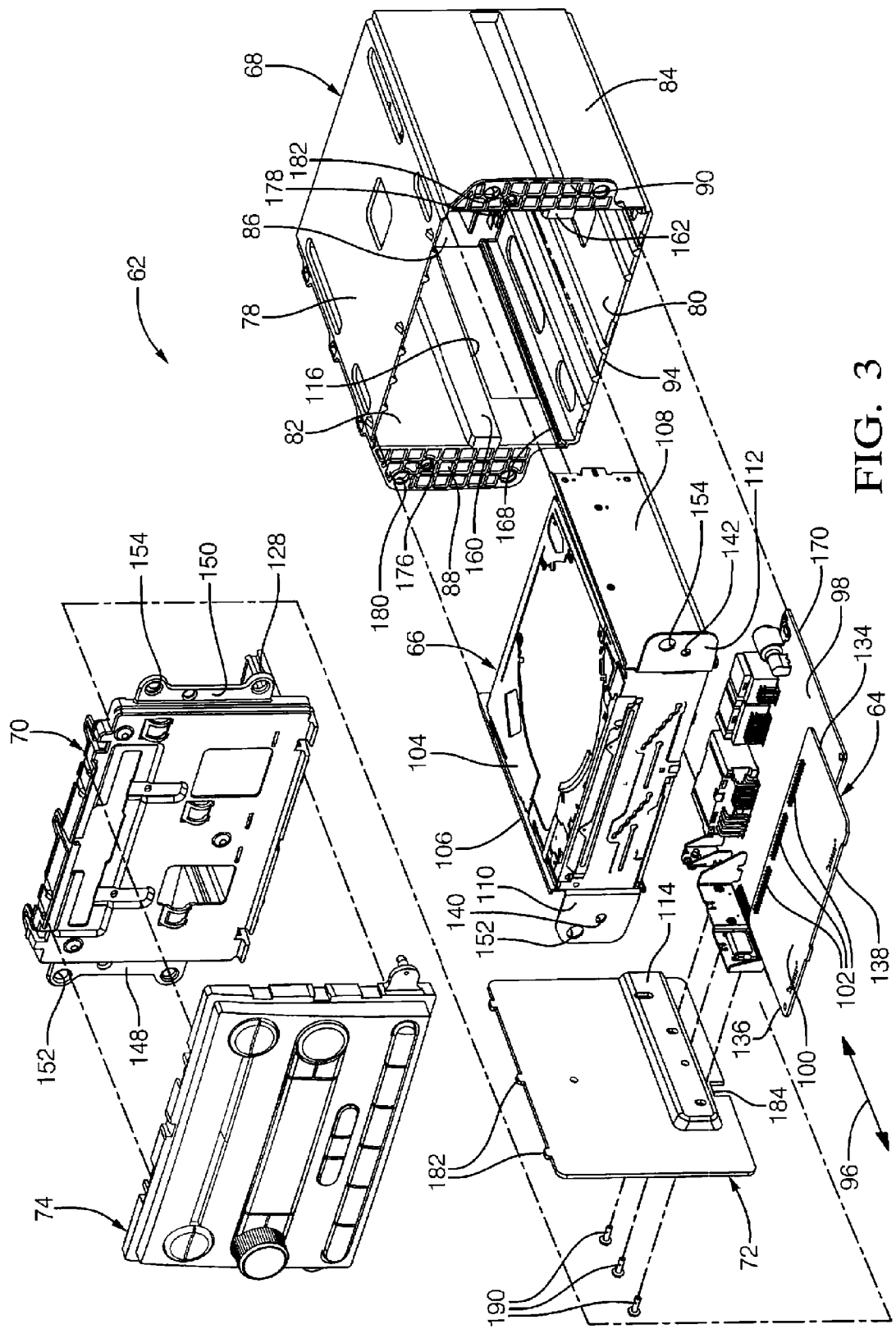
FIG. 3, is an exploded, perspective view of the radio/CD player of FIG. 2, illustrating the major subcomponents and subassemblies thereof.
Figure 4:
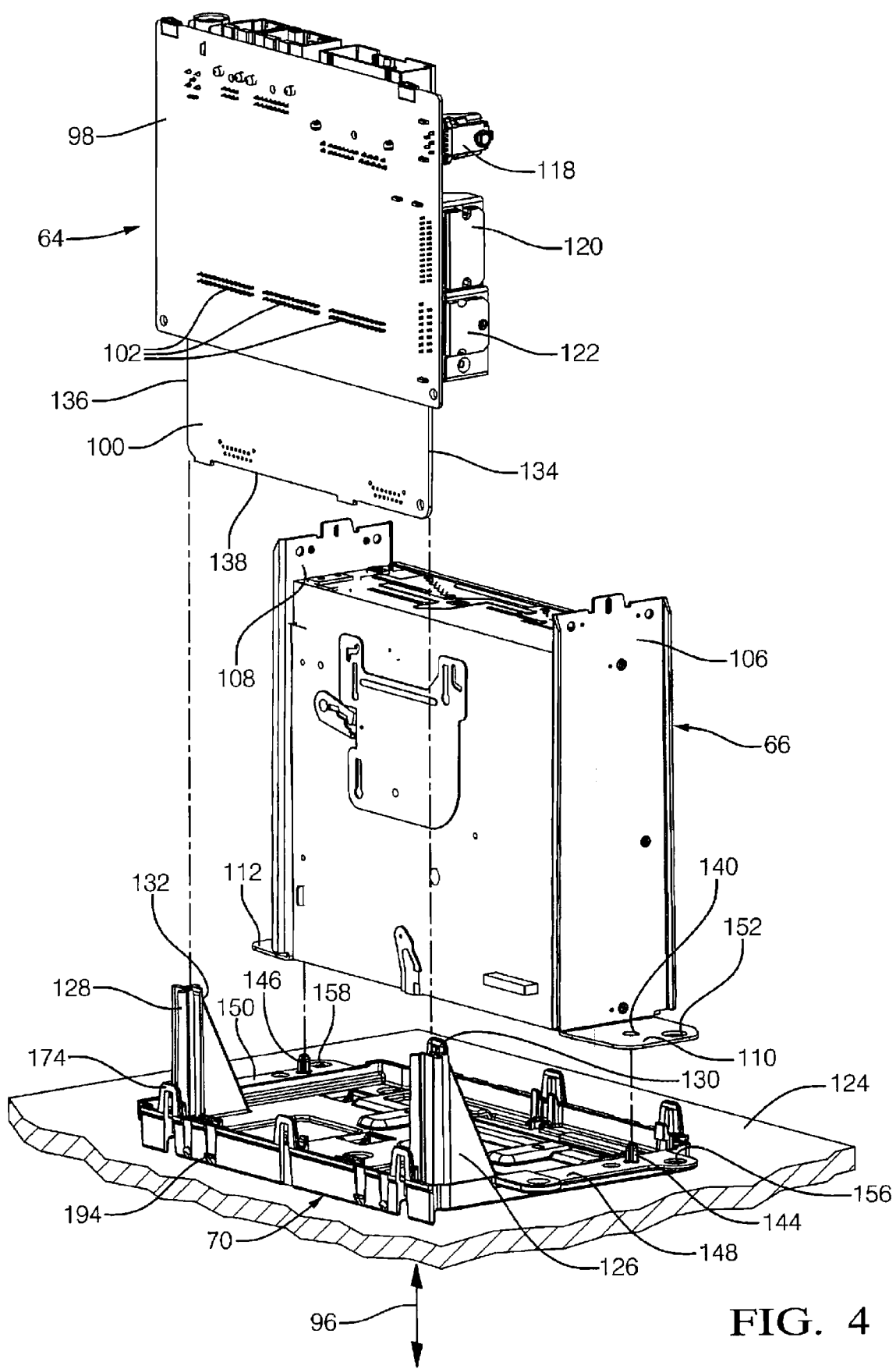
FIG. 4, is an exploded, perspective view of the radio/CD player of FIG. 2, illustrating final assembly step I in the production thereof wherein the playback mechanism and circuit board assembly are slid and snapped to the faceplate.
Figure 5:
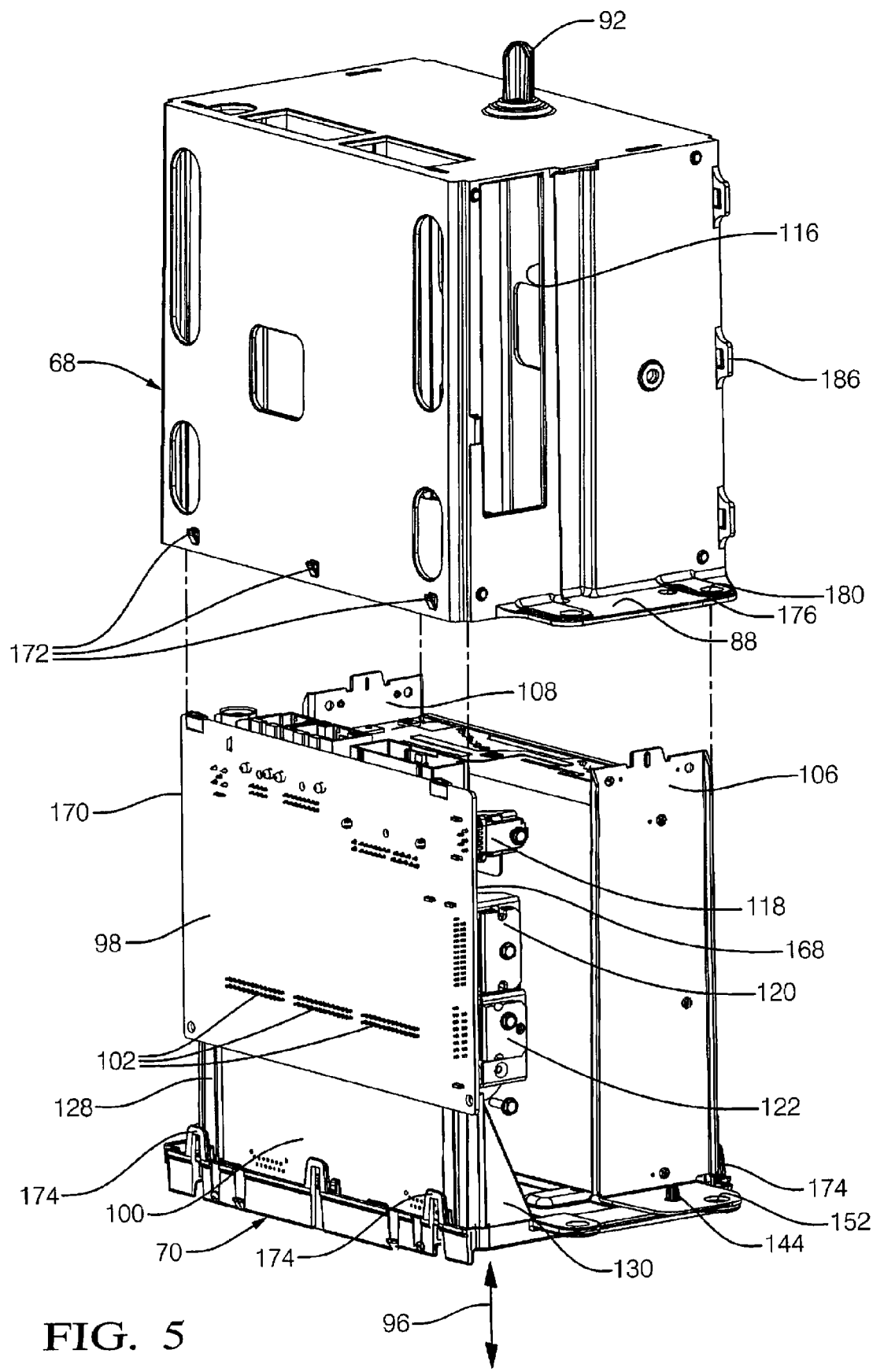
FIG. 5, is an exploded, perspective view of the radio/CD player of FIG. 2, illustrating final assembly step II in the production thereof wherein the case is slid and snapped to the faceplate.
Figure 8:
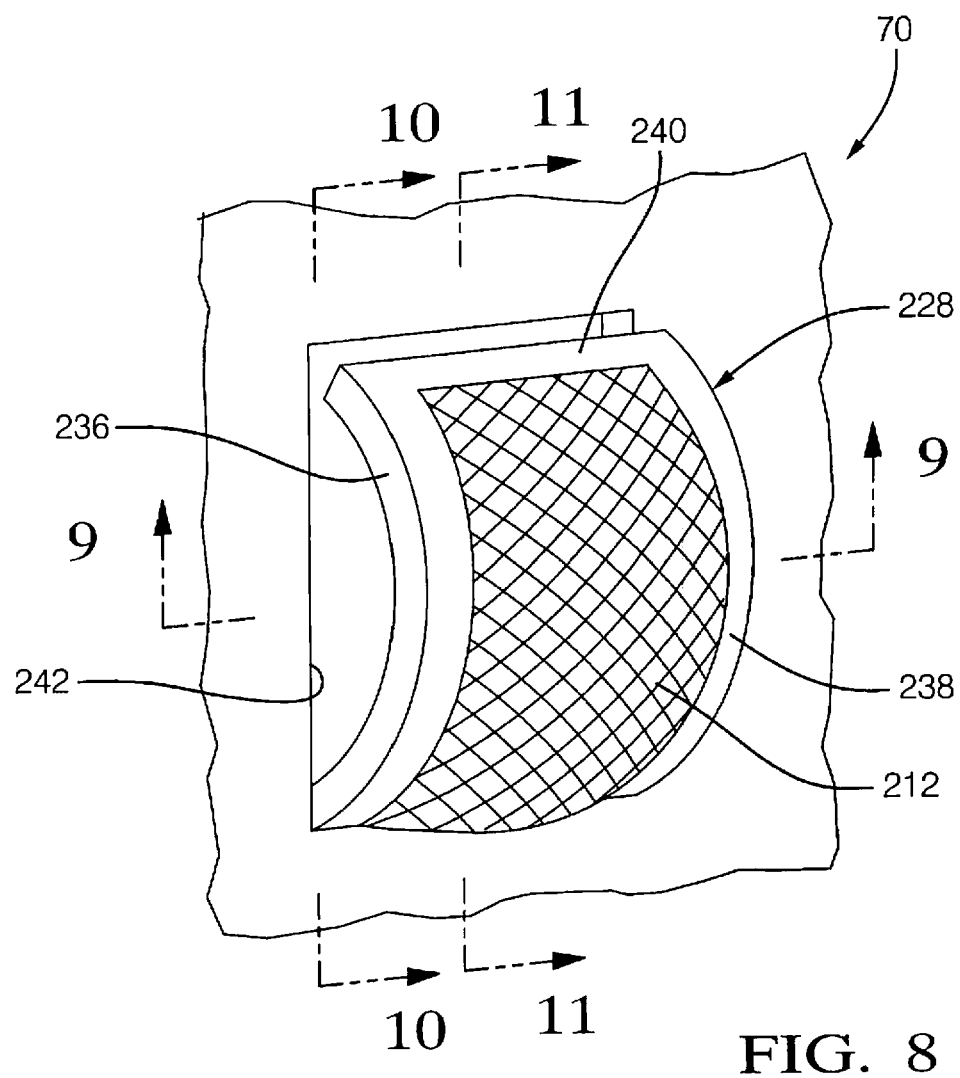
FIG. 8, is a fragmentary, perspective view of a keypad grounding clip integrally formed on the front side of the faceplate.
Figure 9:
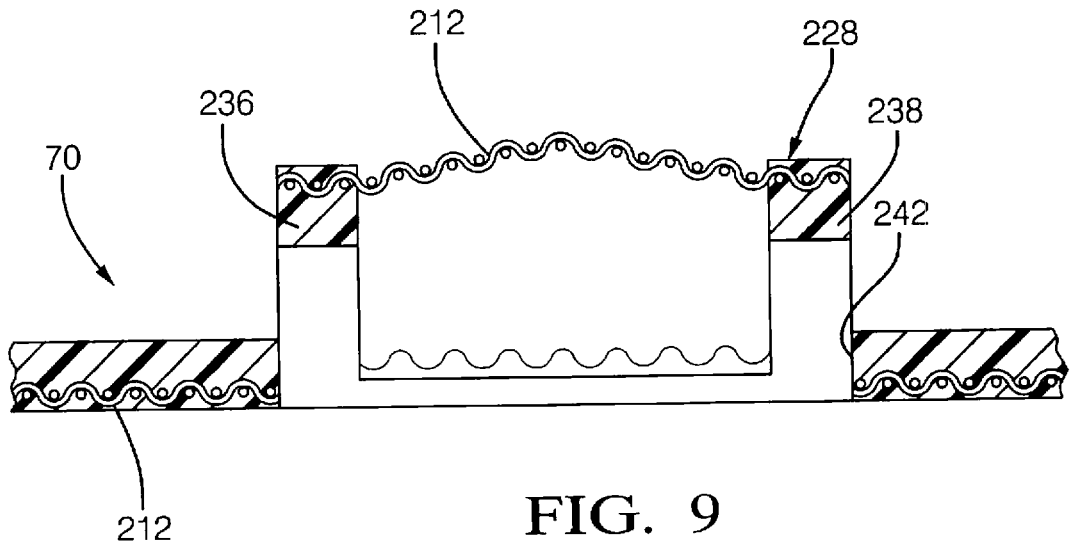
FIG. 9, is a cross-sectional view taken on lines 9-9 of FIG. 8.
Figure 10:
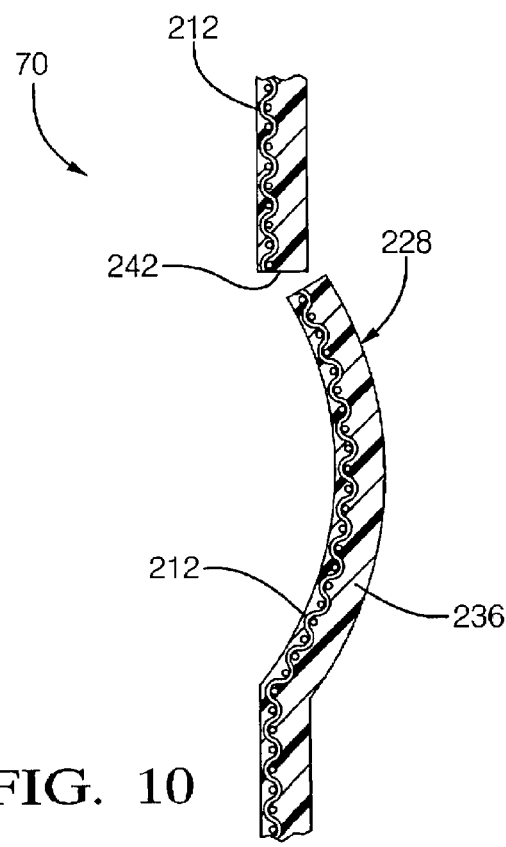
FIG. 10, is a cross-sectional view taken on lines 10-10 of FIG. 8.
Figure 11:
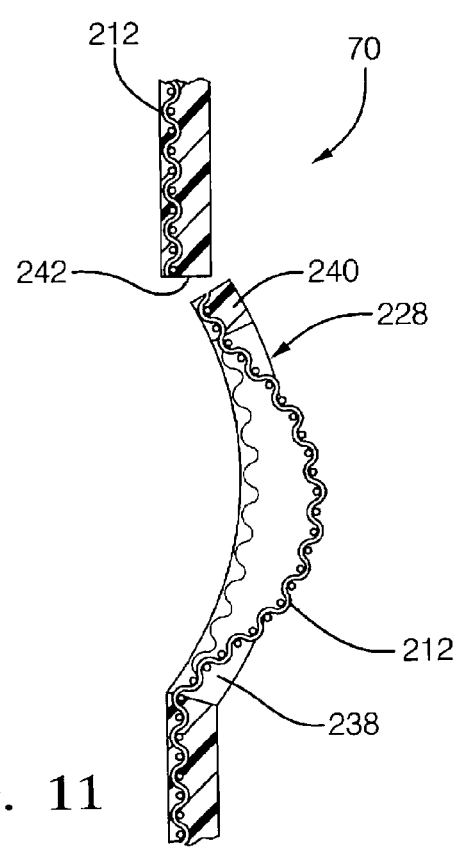
FIG. 11, is a cross-sectional view taken on lines 11-11 of FIG. 8.

FIG. 2 depicts a perspective view of the fully assembled radio/CD player apparatus 62. FIG. 3 is an exploded view illustrating the juxtaposition of the respective major components during the assembly process. FIGS. 4 and 5 depict specific assembly steps of the major components as will be described hereinbelow.

The case 68 and front plate 70 are each preferably injection molded of polymer based material and collectively comprise a substantially closed housing assembly 76. The case 68 has a box-like structure, including upper and lower wall portions 78 and 80, respectively, left and right side wall portions 82 and 84, respectively, and a rear wall portion 86. The case 68 also has mounting features extending externally of the case walls, including left and right front mounting flanges 88 and 90, respectively, extending from the forward edges of the left and right side walls 82 and 84, respectively, and a mounting stud 92 extending rearwardly from the rear wall 86. All of the case wall portions and mounting features of the case 68 are integrally formed in a single injection molding process. The case defines a front opening 94 which, upon assembly, is closed by front plate 70. An assembly axis 96 extends symmetrically from front to rear of the case 68, exiting opening 94 along the nominal centerline of the case 96.

The circuit board subassembly 64 consists of a common or main printed circuit board (PCB) 98 and a unique, application specific PCB 100 which are electrically and mechanically interconnected by several pin connectors 102. It is envisioned that edge connectors, ribbon connectors or the like could be substituted for the pin connectors 102. The common PCB 98 contains all surface mount components. The circuit board subassembly 64 comprises an audio component.

The CD player subassembly 66 consists of a conventional multi-disc player unit 104 and substantially mirror-image left and right side mounting brackets 106 and 108, respectively, affixed thereto by integral fastener devices such as "squirts". Note that there are slight differences between the left and right mounting brackets 106 and 108, but they are deemed to be inconsequential for purposes of the present invention. The left and right mounting brackets 106 and 108 have outwardly directed mounting flanges 110 and 112, respectively, which, upon assembly, register with case mounting flanges 88 and 90, respectively. The CD player subassembly 66 comprises an audio component.

The heat sink 72 comprises a substantially flat, stamped aluminum plate adapted for mounting to the outer surface of the left case sidewall 82 and includes a recessed portion 114 which, upon installation, extends inwardly through a port 116 in left case sidewall 82 for thermal interconnection to heat generating and power circuit components 118, 120 and 122 carried on the main PCB 98.

The trim plate subassembly 74 is configured to organize audio system input/output and display devices, informational indicia and decorative display devices for an associated host vehicle operator.

Referring particularly to FIGS. 4 and 5, a method of assembly of the lightweight audio system 62 of the present invention is illustrated. Audio system 62 can be assembled manually by an ordered process wherein a single (preferably, but not limited to) operator, who sequentially assembles the six major components or subassemblies on a designated work surface 124. No specialized tools or separate/dedicated fixtures are required. No threaded fasteners/screws are required. Each or the major components and subassemblies form integral features which cooperate to interact with features of the other components and subassemblies to register, align and guide the components and subassemblies during adjoining thereof as well as to removably affix the components and subassemblies to one another when in their final design position. This process is referred to herein as the Slide-lock Snaplock™ Screwless Assembly Technology and Method or "SLAT". In effect, the components "self-fixture"one another in combination the manipulation of the Assembly of the radio/CD player 62 is affected by the assembly technician or operator taking the following steps.

As illustrated in FIG. 4, place the front plate 70 on the work surface 124 in an inverted position with the outer surface of the front plate disposed upon the work surface 124. The centerline of the front plate 70 defines an assembly axis, as designated by arrow 96 extending normally to the work surface 124.

The front plate has two laterally spaced, rearwardly directed extensions 126 and 128 integrally formed therewith. Extensions 126 and 128 form guideways or opposed slots 130 and 132, respectively, which open towards one another and are directed parallel to the assembly axis 96. Lateral edge guide surfaces 134 and 136 of the application specific PCB 100 register within slots 130 and 132 and are guided thereby during the insertion process until the leading edge surface 138 of the PCB 100 contacts the inside (upward facing in FIGS. 4 and 5) surface of front plate 70. At this point, common PCB 98 is cantilever suspended from PCB 100 via pin connectors 102 and other supports (not illustrated). Referring FIG. 5, the circuit board subassembly 64 is retained in position by the interfit of the edge surfaces 134 and 136 within slots 130 and 132.

The CD player subassembly 66 is next installed by manipulating it along the assembly axis 96 until through holes 140 and 142, formed in bracket mounting flanges 110 and 112, register with locating pins or nibs 144 and 146 integrally formed in laterally extending mounting flanges 148 and 150, respectively, integrally formed in front plate 70. Thereafter, the CD player subassembly is displaced downwardly along the assembly axis 96 until the lower surfaces of bracket mounting flanges 110 and 112 abut the upper surfaces of front plate mounting flanges 148 and 150. The CD player subassembly 66 is retained in the position illustrated in FIG. 5 by an interference fit between the front plate nibs 144 and 146, and the mounting bracket flange through holes 140 and 142.

Mounting bracket flanges 110 and 112 have secondary, larger diameter through holes 152 and 154 formed therein which register with similarly dimensioned through holes 156 and 158, respectively, formed in front plate mounting flanges 148 and 150 for receiving attachment means such as bolts, for affixing the completely assembled radio/CD player 62 to a host vehicle.

The steps of installing the circuit board subassembly 64 and the CD player subassembly can be reversed from that describer hereinabove.

The housing case 68 is next installed by manipulating it along the assembly axis 96 whereby the case wall portions 78, 80, 82, 84 and 86 fully envelop the circuit board subassembly 64 and CD player subassembly 66 in combination with the front plate 70.

Figure 20:
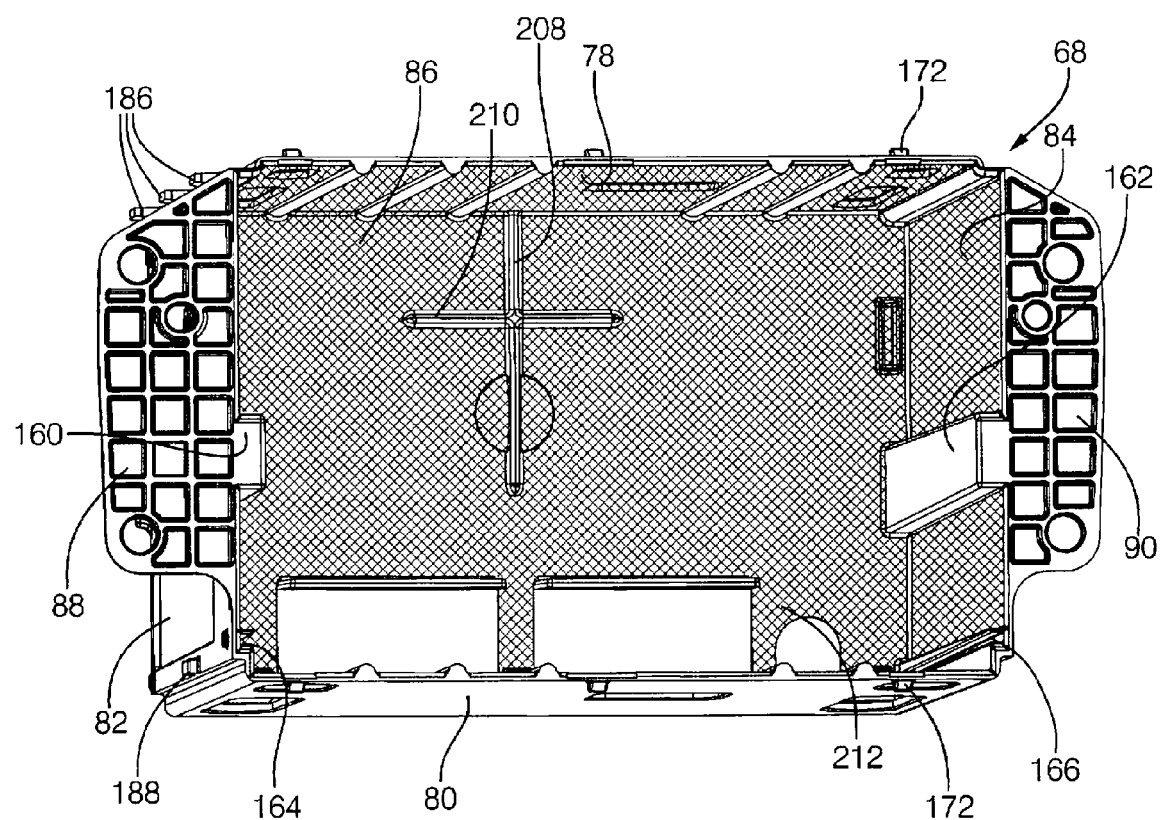
FIG. 20, is a front perspective view of the interior surface details of the case/back-end illustrating the wire mesh screen which has been insert molded within the case adjacent the inner surface portions thereof.

As best viewed in FIGS. 3, 5 and 20, the centerline of the case 68 is first manually aligned with the assembly axis 96 and rotationally positioned with the subassembly consisting of the circuit board subassembly 64, CD player subassembly 66 and the front plate 70, whereby a first cooperating pair of guideways 160 and 162 integrally formed in case sidewall portions 82 and 84 register with the CD player mounting brackets 106 and 108 and, simultaneously, a second cooperating pair of guideways 164 and 166 integrally formed in case sidewall portions 82 and 84 register with lateral edge guide surfaces 168 and 170 of common PCB 98. The case 68 is then manually displaced along the assembly axis 96 until the leading edge thereof defining front opening 94 contacts the rear surface of the front plate 70. Thereafter, cooperating ramped snap-engagement features 172 and 174 integrally formed with upper and lower wall portions 78 and 80 of the case 68 and the front plate 70, respectively, momentarily self-displace one another and snap back to self-engage to establish a positive interlock therebetween.

The case mounting flanges 88 and 90 form through holes 176 and 178 which register and self-engage with nibs 144 and 146, respectively, to provide a redundant engagement feature. Furthermore, the case mounting flanges 88 and 90 form a second set of through holes 180 and 182, respectively, which register with through holes 152 and 154 of mounting brackets 106 and 108, and through holes 152 and 154 of front plate mounting flanges 148 and 150, respectively.

As best viewed in FIG. 2, the heat sink 72 is next installed. The heat sink 72 includes several locating tabs 182 integrally formed along one edge thereof and a locator recess 184 formed in an opposed edge. The heat sink 72 is manually affixed to the outer surface of the case left side wall portion 82 which defines integral tab receiving extensions 186 along the upper edge thereof. Once the heat sink locating tabs 182 are inserted within their respective case wall portion extensions 186, the heat sink 72 is rotated into its design position wherein a resilient ramped catch member 188 integrally formed along the bottom edge of the left side wall portion 82 snap engages the recess 184 to fixedly interlock the heat sink 72 to the case 68.

When the heat sink 72 is in its installed position, the recessed portion 114 extends inwardly into the case 68 through the port 116. The inner surface of the recessed portion 114 establishing an abutting relationship against the power circuit components 118, 120 and 122 to provide a cooling thermal convector to the exterior of the case 68. Means are provided to ensure that components 118, 120 and 122 remain in intimate contact with the heat sink 72 such as screws 190, or, preferably to continuously resiliently urge the components into engagement with the recessed portion 114 of the heat sink 72.

It is contemplated that the heat sink 72 could be alternatively mounted to the case rear wall portion 86, whereby it would be installed along the assembly axis 96.

As a final step of assembling the major components and subassemblies, the subassembly of the components is manually inverted, with the case rear wall portion 86 disposed on the designated work surface 124. Due to the localized outward projection of the stud 92, a stability enhancing spacer (not illustrated) or, alternatively, a recess 192 in the work surface 124 ensures a stable platform to complete assembly.

The trim plate subassembly 74 is then manipulated to become in register with the case 68 and manually displaced along the assembly axis 96 until the lower surface of the trim plate assembly 74 contacts the upper surface of the front plate 70. Thereafter, cooperating ramped snap-action engagement features 192 and 194 integrally formed with upper and lower edge skirt surfaces of the case trim plate assembly 74 and the front plate 70, respectively, momentarily self-displace one another and snap back to self-engage to establish a positive interlock therebetween.

The completed assembly of the major components and subassemblies is depicted in FIG. 2. Following the assembly process, the completed radio/CD player 62 is placed in a queue for testing and quality checks.

The rear mounting bushing for current radios is typically attached by welding a threaded stud to the back wall of the wrap around and then the bushing is screwed on. With the plastic box receiver, the mounting bushing can be molded as an integral part of the receiver box, eliminating two part numbers and the labor to install them.

Figure 21:
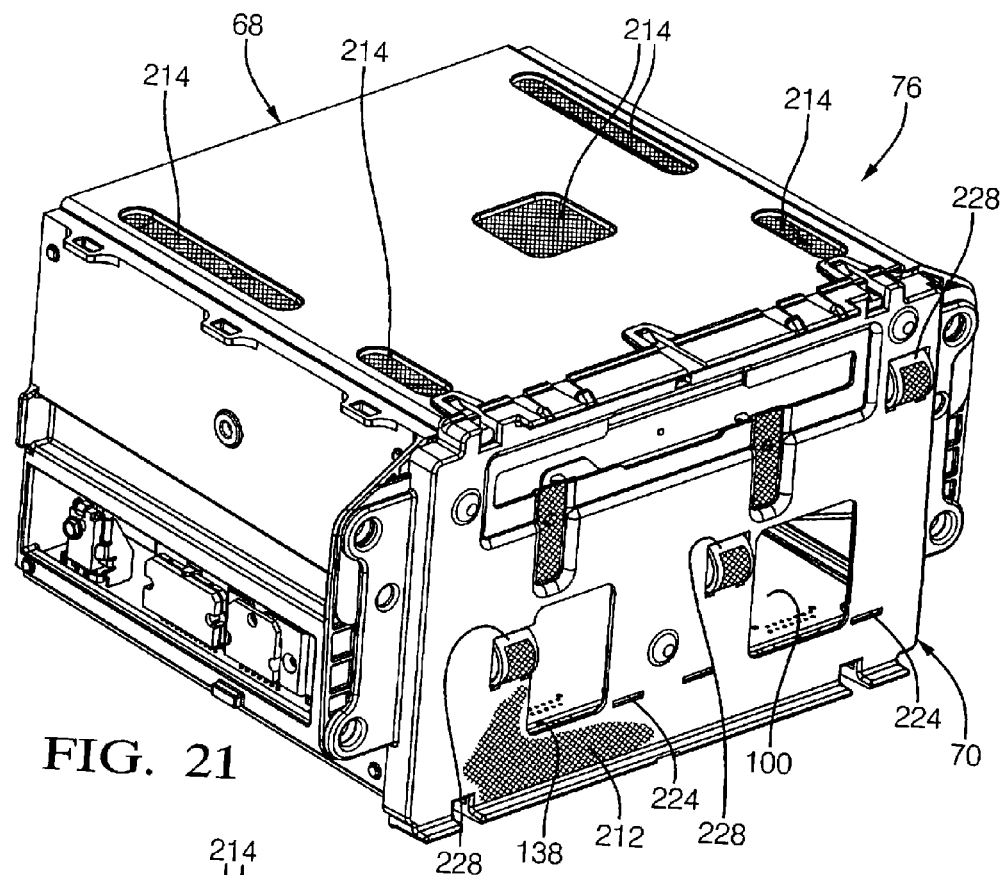
FIG. 21, is a front-above perspective view of a partially assembled radio/CD player, substantially similar to that previously depicted (prior to installation of the trim plate assembly), illustrating, inter alia, (1) three outwardly directed spring contacts carried by resilient members integrally formed with the faceplate and (2) the juxtaposition of the wire mesh within the faceplate adjacent the outer surface thereof.
Figure 22:
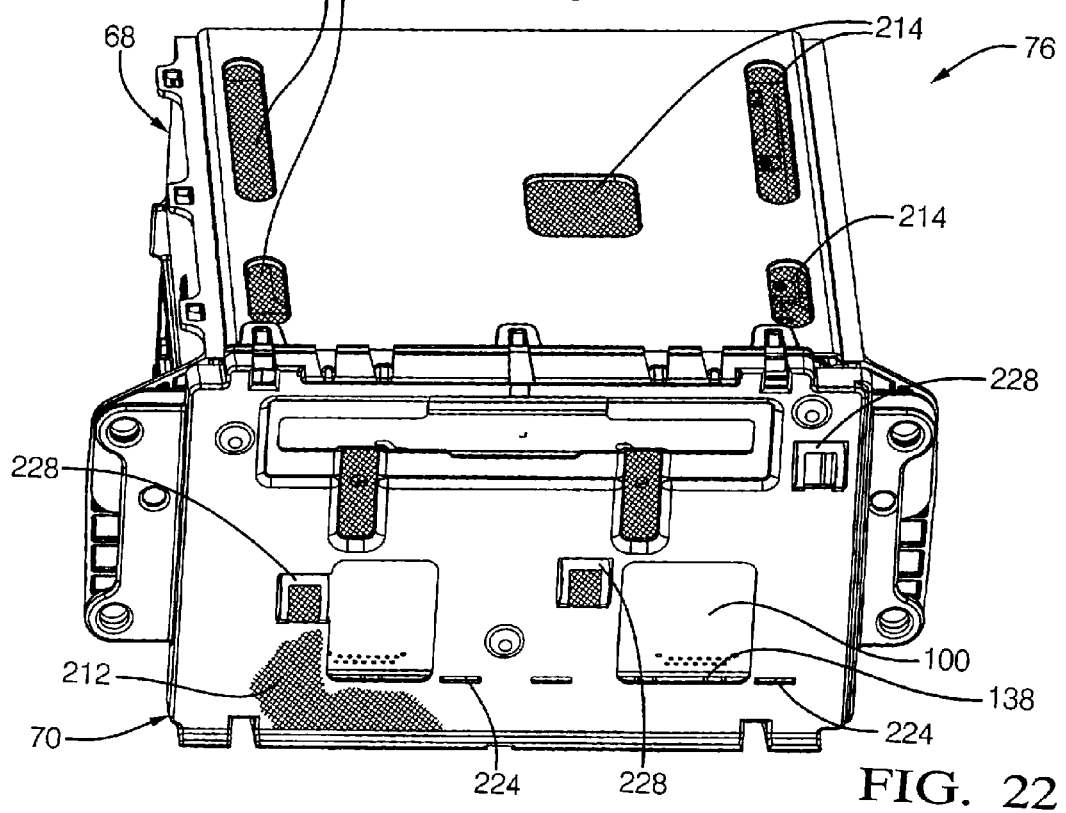
FIG. 22, is a front-left perspective view of the partially assembled radio/CD player of FIG. 21, illustrating the same features from a different perspective.

FIGS. 20-22 illustrate an alternative construction of the case 68 and front plate 70 of the housing assembly 76 wherein both elements of the case assembly 76 are formed of a composite of relatively rigid polymer material and electrically conductive material operable to shield the audio components (such as the circuit board subassembly 64 and the CD player subassembly 66) from electrical anomalies including radio frequency interference (RFI), electromagnetic interference (EMI), bulk current injection (BCI) and electrostatic discharge (ESD). The electrically conductive material comprises substantially continuous planer sheet portions applied to surfaces of or within polymer housing assembly wall portions as discrete elements, electrically conductive paint, foil or electrostatic or vacuum deposition applied material. Alternatively, the electrically conductive material comprises a wire mesh screen 212 which has been cut and folded to net shape and inserted within a mold cavity whereby it is effectively insert molded within the polymer based material. Preferably, the wire screen 212 is centered within the wall portions of the case and front plate whereby electrically insulating polymer material effectively covers the wire screen 212, both inside and out, to prevent inadvertent grounding of the housing assembly to interior or exterior structures.

Through empirical testing and development, the inventors have found that it is preferable to locate the wire screen 212 near the inside surface of the case 68 and the outside surface of the front plate 70. Openings 214 are provided in the case 68 by locally eliminating the polymer material but leaving the wire screen intact, whereby judiciously positioned openings 214 provide natural convection cooling to the ambient without having a break or gap in the electrical anomaly protection provided by the wire screen 212.

The common circuit board and the unique circuit board are grounded to the molded in wire mesh by using a grounding clip that contacts the ground plane on the circuit board to the metal mesh by pressing the circuit board with the clip installed into a hole or recess in the plastic box that exposes the mesh. A point/ridge/protuberance is used on the clip to press into the mesh and increase the pressure for intimate contact. An alternative of this clip is one that gets surface mounted and soldered to the board and does not require manual assembly.

Referring to FIGS. 6 and 7, one form of grounding the ground plane 216 of the circuit board subassembly 64 to the wire screen 212 is illustrated. The leading edge surface 138 of the unique PCB 100 carries two beryllium copper grounding clips 218, which are electrically and mechanically connected to the PCB ground plane 216. Similarly, a trailing edge surface 222 of the common PCB 98 carries two grounding clips 218. Each grounding clip 218 includes a resilient contact arm 220 extending outwardly along the assembly axis 96. Upon assembly, the grounding clips 218 carried on the leading edge surface 138 of PCB 100 register with exposed wire screen 212 within windows 224 in front plate 70 (refer FIGS. 21 and 22), and the grounding clips 218 carried on the trailing edge surface 222 of PCB 98 register with exposed wire screen 212 within windows 226 in the rear wall portion 86 of the case 68. The contact are 220 of each grounding clip 218 is configured to continuously bear against the adjacent exposed wire screen 212 to maintain electrical contact therewith.

Figure 23:
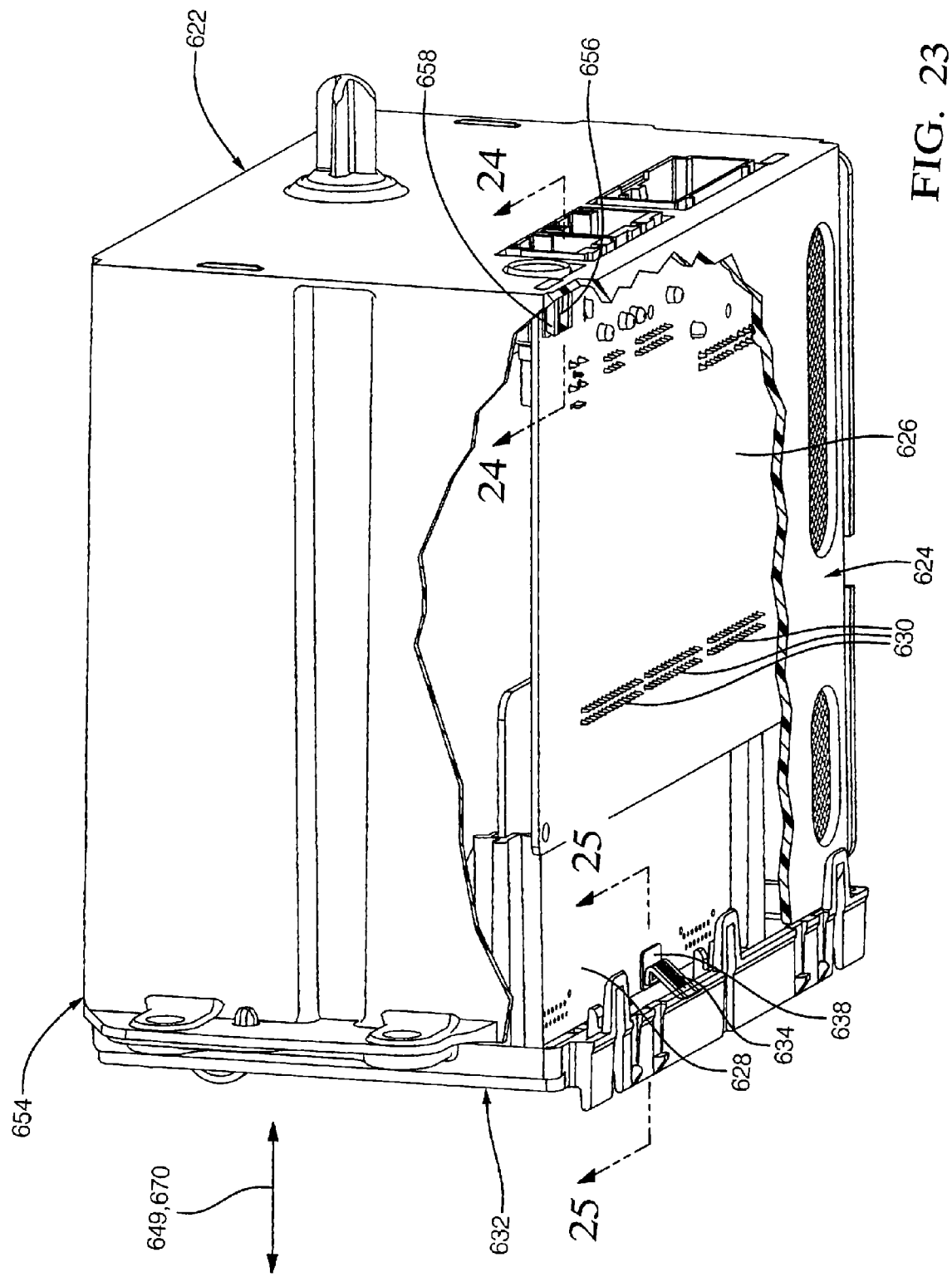
FIG. 23, is a broken, bottom-rear perspective view of an audio system assembly embodying an alternative embodiment of the present invention illustrating internal PCB front and rear edge self-grounding with integral features of the audio system housing assembly.

Referring to FIGS. 23-27, alternative forms of grounding the ground plane 216 of the circuit board subassembly 64 to the wire screen are illustrated. FIG. 23 illustrates a radio/CD player 622 similar in all material respects to the radio/CD player 62 described hereinabove in connection with FIGS. 2-11 inter alia, with the exceptions described immediately hereinbelow. In essence, in this embodiment, the four ground clips 218 contained on the circuit board subassembly 64 are deleted and replaced by connectors integrally formed with the housing assembly 76.

Figure 25:
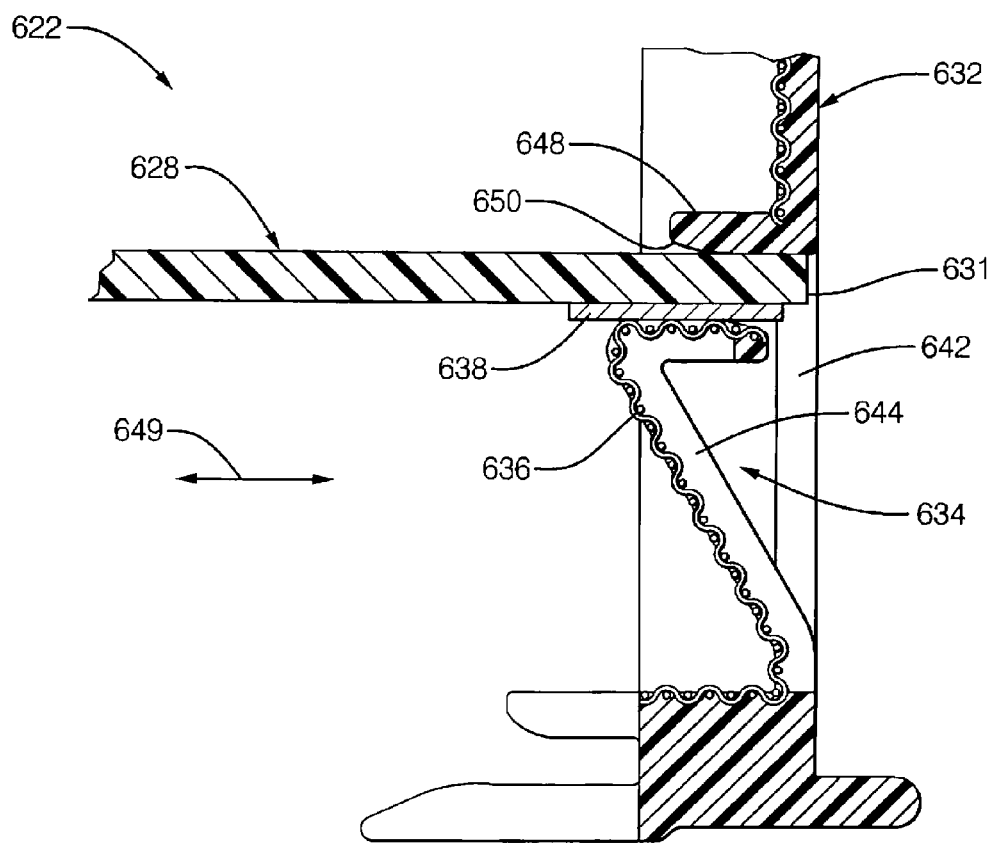
FIG. 25, is a broken, cross-sectional view, on an enlarged scale, of the front edge of the PCB of FIG. 23 self-engaging and self grounding with exposed electrically conductive shield and guide tangs integrally formed with the audio system housing assembly.
Figure 27:
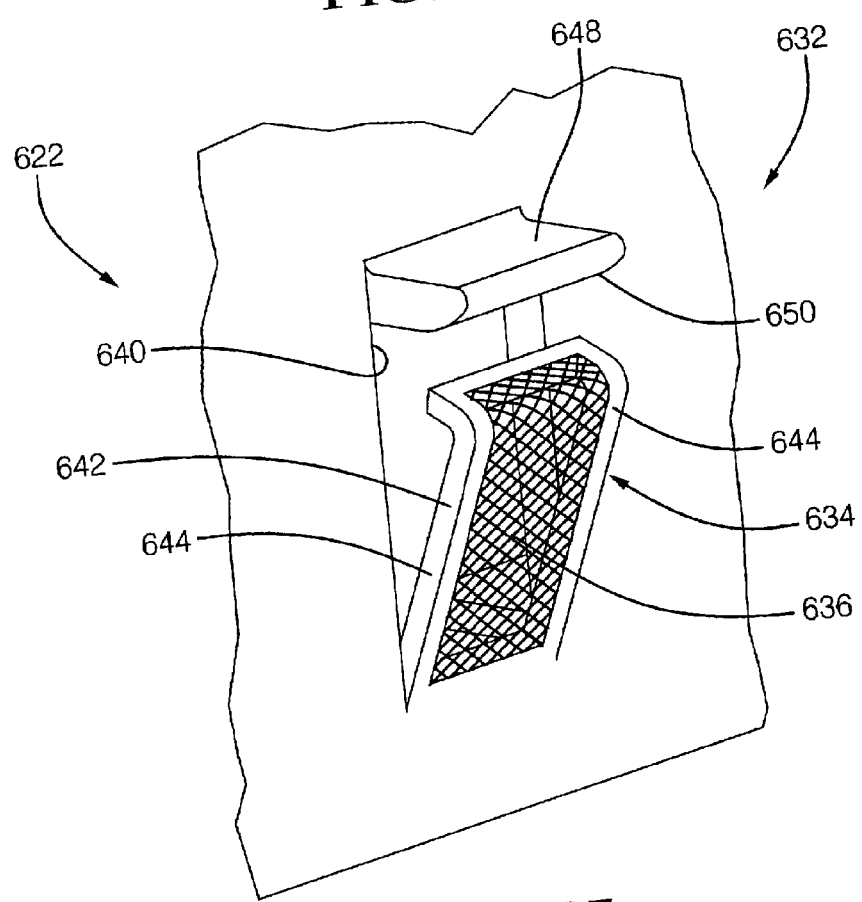
FIG. 27, is a broken, forward facing perspective view of the exposed electrically conductive shield and guide tangs of FIG. 25, with the PCB removed.

Referring to FIGS. 23, 25 and 27, a circuit board subassembly 624 includes a common PCB 626 interconnected with a unique PCB 628 by pin connectors 630. A leading edge 631 of the unique PCB 628, when installed within a front plate 632, engages two Z-clips 634 integrally formed within the front plate 632, whereby wire screen 636 exposed in the Z-clip 634 engages a contact pad/plane 638 carried on the unique PCB 628 adjacent its leading edge 631. A trailing edge 652 of the common PCB 626, when installed in a housing case 654, engages two grounding clips 658 integrally formed within the case 654, whereby wire screen 636 exposed in the grounding clip 656 engages a contact pad/plane 658 carried on the common PCB 626 adjacent its trailing edge 652.

As best viewed in FIGS. 25 and 27, the Z-clip 634 includes a frame 640 integrally formed adjacent one side of an associated opening 642 and extending inwardly (within an associated housing case 643) therefrom as a resilient cantilever. The frame 640 includes two parallel "L" or "J" shaped leg portions 644 interconnected by a cross support portion 646. A flap of wire screen 636 is die-cut prior to being injection molded within the front plate 632. During the injection molding process, the edges of the wire screen flap are insert molded within the leg portions 644, the cross-support portion 646 and the adjacent front panel of the front plate 632, thereby exposing the wire screen flap 636 for electrical connection with the unique PCB contact pad 638. An inwardly directed boss 648 is integrally formed on the front plate 632 adjacent an edge of the opening 642 opposite from the leg portions 644, and extends substantially parallel to an assembly axis 649. The boss 648 forms a guide/abutment surface 650 which is spaced from the exposed wire screen flap 636 by a dimension slightly less than the thickness of the unique PCB 628 to ensure a tight compressive fit when the leading edge 631 of the unique PCB 628 is inserted therebetween. The natural resiliency of the polymer material forming the Z-clip frame 640 ensures continued continuity of the electrical connection between the exposed wire screen 636 of the Z-clip and the unique PCB contact pad 638.

Figure 24:
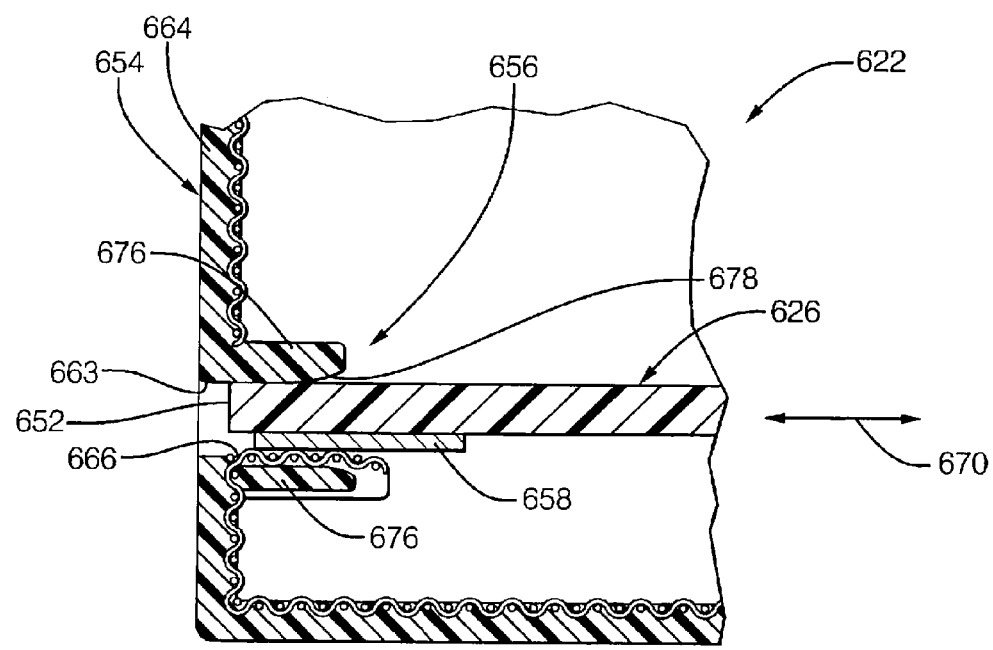
FIG. 24, is a broken, cross-sectional view, on an enlarged scale, of the rear edge of the PCB of FIG. 23 self-engaging and self-grounding with exposed electrically conductive shield and guide tangs integrally formed with the audio system housing assembly.
Figure 26:
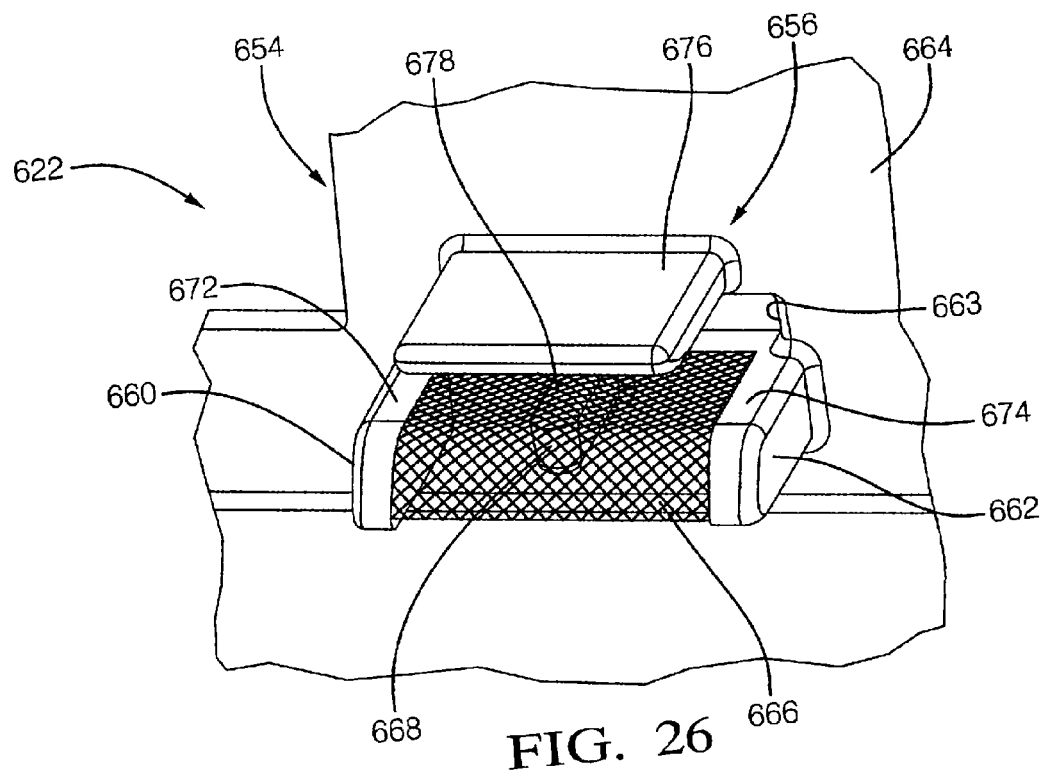
FIG. 26, is a broken, rear facing perspective view of the exposed electrically conductive shield and guide tangs of FIG. 24, with the PCB removed.

As best viewed in FIGS. 24 and 26, the grounding clip 656 includes a cooperating pair of laterally spaced support members 660 and 662 integrally formed in a rear wall portion 664 of the case 654 adjacent the bottom edge of an associated opening 663 and extending inwardly therefrom. A flap of wire screen 666 is die-cut prior to being injection molded within the case 654. During the injection molding process, the lateral edges of the wire screen flap 666 are insert molded within the support members 660 and 662 and the adjacent portion of the case rear wall portion 664, thereby exposing the wire screen flap 666 for electrical connection to the common PCB 626 contact pad 658. A wire screen positioning finger 668 is integrally formed in the rear wall portion 664 of the case 654 laterally intermediate the support members 660 and 662, and extends inwardly from the rear wall portion 664 substantially parallel to an insertion axis 670 as a resilient cantilever. The positioning finger 668 is vertically positioned with respect to the support members 660 and 662 to continuously contact the lower surface of the wire screen flap 666 to ensure that the lateral center portion of the wire screen flap 666 is bowed slightly upwardly and resiliently maintained at least slightly above the upper surface portions 672 and 674 of the support members 660 and 662, respectively. An inwardly directed boss 676 is integrally formed on the rear wall portion 664 of the case 654 adjacent the top edge of the opening 663 opposite from and laterally centered with the support members 660 and 662. The boss 676 forms a guide/abutment surface 678 which is spaced from the exposed wire screen flap 666 by a dimension slightly less than the thickness of the common PCB 636 to ensure a tight compressive fit then the trailing edge 652 of the common PCB 636 is inserted therebetween. The natural resiliency of the polymer material forming the ground clip 656 structural elements ensures continued continuity of the electrical connection between the exposed wire screen 666 of the ground clip 656 and the common PCB contact pad 658.

In another example of self-grounding a PCB 680 includes an extension 682 projecting forwardly therefrom in line with an assembly axis 684 of a housing case 686 for an audio system 687. Contact pads 688 and 690 are carried on upper and lower surfaces 692 and 694 of the PCB extension 682. A rear wall portion 696 of the case 686 forms a window 698 exposing a portion of wire screen 700 which is aligned with the PCB extension 682. When the wire screen 700 is insert molded within the polymeric material forming the case 686, the portion thereof coinciding with the window 698 is left intact. During the assembly process of the audio system 687, wherein the PCB is installed by insertion along guideways (not illustrated) within the case 686, the PCB is inserted with sufficient force to locally rupture and penetrate the exposed wire screen 700 within the window 688. Following the rupture of the wire screen 700, the residual separation edges thereof are drawn into the window 698 by friction caused by motion of the upper and lower PCB surfaces 692 and 694, respectively. When the PCB 680 assumes its installed position, as illustrated in FIG. 139, the rended portions of the wire screen 700 are compressively fit between the contact pads 688 and 690 and the adjacent edges of the window 698, ensuring continued continuity of the electrical connection between the exposed wire screen 700 and the PCB contact pads 688 and 690. It is contemplated that a single (one side of the PCB) contact pad can also be employed. However, the redundancy afforded by the dual contact pads 688 and 690 is preferable.

In a modification of the self-grounding system described hereinabove can enhance assembly of an audio system 702 for simplified and improved unit-to-unit repeatability. A housing case 704 includes a wall portion 706 forming a window 708 exposing a wire screen 710 to establish a point of electrical connection to an audio component within the case 704. After the wire screen 710 is insert molded within the polymer material forming the case 704, but before the assembly if the audio system 702, a tool, such as a cooperating punch 712 and die 714 is pressed simultaneously against the inner and outer surfaces of the exposed screen 710 within the window 708 to form perforations or weakenings, indicated by dotted lines 716. This process step is indicated by arrows 718. The perforations 716 make the exposed wire screen 710 more predictably frangible for improved unit-to-unit quality. Thereafter, during final assembly of the audio system 702, the wire screen 710 separates along the perforations 716 when contacted by the leading edge of a PCB extension 682.

An alternative self grounding approach involves modifying a leading surface 720 of an extension 722 of a PCB 724 to form a sharpened, laterally extending leading edge 726. The leading edge 726 can be formed by the PCB material itself or, preferably, by hardened material, such as a metal appliqué or band formed in a "U" or a "V" configuration engaging the PCB 724 by upper and lower members 728 and 730 affixed to the upper and lower surfaces 732 and 734 of the PCB extension 722 such as by soldering. The upper and lower members 730 and 732 can serve as electrical ground pads. Upon installation of the PCB 724, the sharp leading edge 726 first contacts and cleaves the exposed wire screen 710 into the form illustrated in FIG. 139.

In addition to the forgoing, punch dies 712/714 such as those depicted in FIG. 156 can be employed in modified form to actually sever and/or remove a portion (or all) of the wire screen 710 after the molding of the housing case 704, but before the final assembly of the audio system 702. Furthermore, one or more service access windows can be provided elsewhere in the walls of the housing case 704. The service windows are closed at the time of manufacture by exposed screen including perforations. The exposed screen could be severed by a tool or process later in the service life of the audio system 702 to service or modify the system.

The method of grounding the plastic front plate (with molded in metal mesh) to the keyboard is by using plastic spring clip that contains an open window to expose the mesh where the spring clip comes into contact with a tinned pad on the keyboard. This provides an ESD path to ground when inserting a static charged CD into the CD changer.

Referring to FIGS. 8-11 and 21-22, several spring clip structures 228 are integrally formed in the front plate 70 which, in assembly, continuously resiliently bear locally exposed segments of the wire screen 212 against a tinned grounding pad 230 (only one is illustrated) on a keypad PCB 232 to establish a ground path therebetween.

Each spring clip structure 228 has a frame 234 including two parallel arc shaped portions 236 and 238 and a cross-support portion 240 integrally formed with front plate 70 and extending therefrom as a resilient cantilever. An opening 242 in the front plate registers with each spring clip 228 to permit flexure thereof.

Prior to molding of the wire screen 212 within the front plate 70 the screen preform is die-cut to form an integral flap which is captured within the mold and the edges thereof encased within arc-shaped portions 236 and 238 and cross-support portion 240. The central portion of the exposed wire screen is expanded or stretched to form an outward bow shape (refer FIGS. 9 and 10) to ensure that the resulting exposed screen protuberance firmly contacts the PCB grounding pad 230.

A prior approach is illustrated wherein separate spring grounding clips 244 are each mechanically affixed to the front plate 246 of a radio/CD player assembly 248 by a rivet 250 or other suitable fastener. The rivets are required to establish an electrical ground path as well as to mechanically secure the spring clips 244 to the front plate 246, adding labor, cost and complexity to the manufacturing process.

Using a plastic front plate enables assembly fixturing for the CD mechanism and circuit boards for slide lock and snap lock assembly instead of the screws used in a traditional receiver.

Referring to FIGS. 4 and 5, guideways in the form of slotted extensions 126 and 128, as well as locator/retention features 144 and 146 integrally formed on the reverse (inside) surface of the front plate 70 provides a number of significant advantages in the manufacture and final assembly of the radio/CD player 62 by reducing product part count, assembly time, and substantially eliminates dedicated hard fixturing and tools to affect assembly.

Using a plastic box for the receiver enables low cost location and support for the CD mechanism and enables for slide lock assembly instead of the screws used in a traditional receiver. The brackets on the CD mechanism have a 1° taper that matches a 1° taper on the support shelf in the plastic box. This makes it easy for an operator to start the slide, but all of the clearances go to zero as the box snaps into place providing a strong rattle free assembly without the use of the traditional screws.

Figure 12:
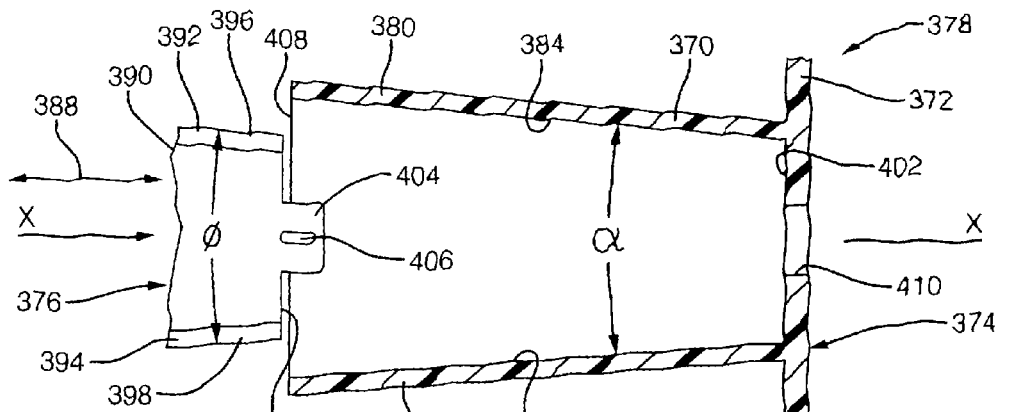
FIG. 12, is a fragmentary, cross-sectional view of the initial positioning of a CD mechanism bracket with respect to a support shelf integrally formed within the case.
Figure 13:
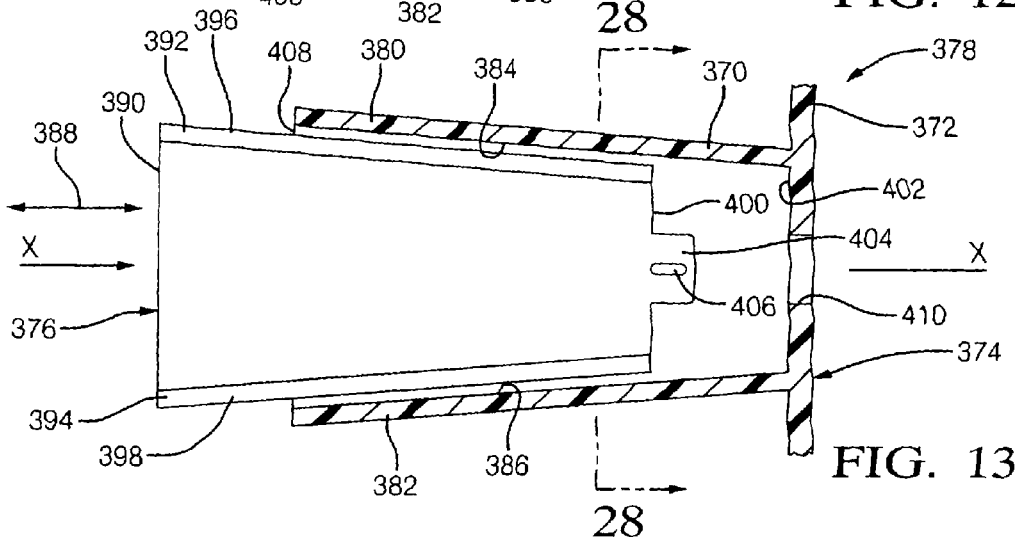
FIG. 13, is a fragmentary, cross-sectional view of the CD mechanism in an intermediate position with respect to the support shelf during its installation.
Figure 14:
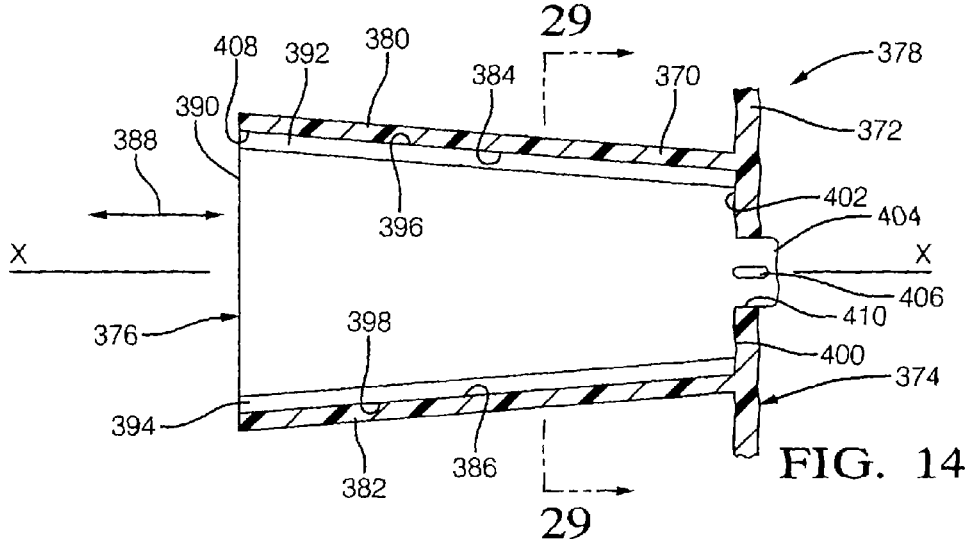
FIG. 14, is a fragmentary, cross-sectional view of the CD mechanism in its final installed position with respect to its associated support shelf.

Referring to FIGS. 12-18, 28, 29 and 32, the details of the mounting of the CD player subassembly 66 within the housing case 68 (refer FIG. 3) are illustrated in a simplified form. FIGS. 12-14 represent a longitudinal cross-section of a case guideway 370, including a rear wall portion 372 taken just laterally inside of the right side wall portion (not illustrated) of a housing case 374 to illustrate the spacial cooperation between the case guideway 370 and a right side CD player mounting bracket 376 during the insertion thereof in the assembly of a radio/CD player 378. A mirror-image case guideway is integrally formed on the opposite, left wall portion of the case 374.

The guideway 370 is integrally formed with the right sidewall portion (not illustrated) and the rear wall portion 372 of the housing case 374, projecting laterally therefrom. The guideway 370 is generally "C" shaped, having laterally disposed upper and lower leg portions 380 and 382 extending longitudinally the entire depth of the case 374. The leg portions 380 and 382 form continuously converging or tapered surfaces 384 and 386, respectively, which are offset by an angle α (nominally 1°) vertically centered above and below a longitudinal assembly axis 388. The mounting bracket 376 is preferably stamped from sheet aluminum or similar material and is also generally "C" shaped, having a vertical portion 390 and laterally disposed upper and lower leg portions 392 and 394 extending longitudinally substantially the entire depth of the case 374. The leg portions 392 and 294 form continuously converging or tapered surfaces, respectively, which are offset by an angle φ (nominally 1°). The mounting bracket 376 has a leading edge surface 400 which, upon assembly, approaches the inside surface 402 of the case rear wall portion 372. The vertical portion 390 of the mounting bracket 376 has a rearwardly directed integral tab 404 extending from edge surface 400. The tab 404 has a localized upset bead or rib 406.

Figure 28:
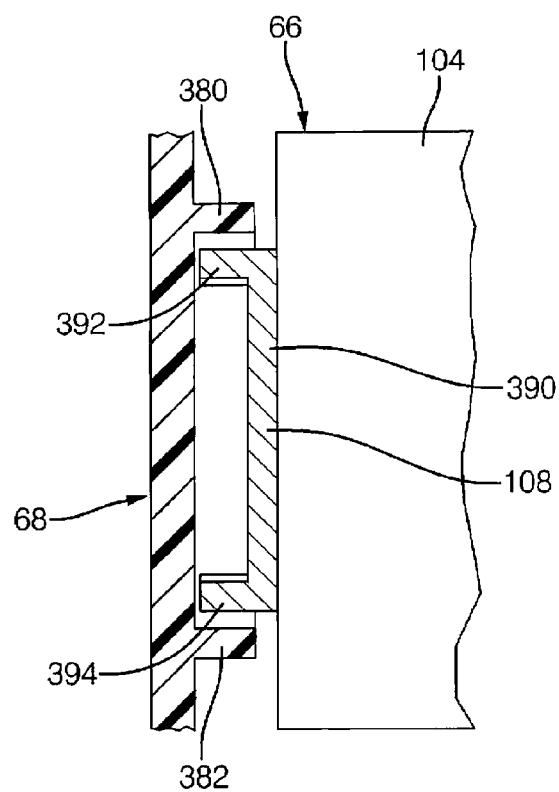
FIG. 28, is a cross-sectional view taken on lines 28-28 of FIG. 13, illustrating the juxtaposition of an associated pair of guideways formed by a housing case and guide members formed by a CD changer mounting bracket with the bracket partially installed within the case.

The CD player subassembly is installed by manually aligning the leading edge surface 400 of the mounting brackets 376 with the opening 408 of the guideway 370 (refer to FIG. 12) and rearwardly displacing it along the assembly axis 388. FIGS. 13 and 28 illustrate a mid-point in the insertion process wherein the guideway surfaces 384 and 386 remain substantially parallel to the cooperating mounting bracket surfaces 396 and 398. The guideway serves to register, align and guide the insertion of the mounting brackets 376. As the CD player subassembly 66 approaches the installed position depicted in FIGS. 14 and 29, the guideway surfaces 384 and 386 contact the mounting bracket surfaces to effectively provide a zero-tolerance interfit therebetween. This ensures precise positioning and effectively eliminates squeaks and rattles in application. As best viewed in FIGS. 14-18, in the installed position, the tabs 404 slip-fit penetrate into an opening or recess 410 in rear wall portion 372. The upset rib 408 forms an interference-fit within the window 410 to lockingly engage the CSD player subassembly 66 within the case 374.

Figure 30:
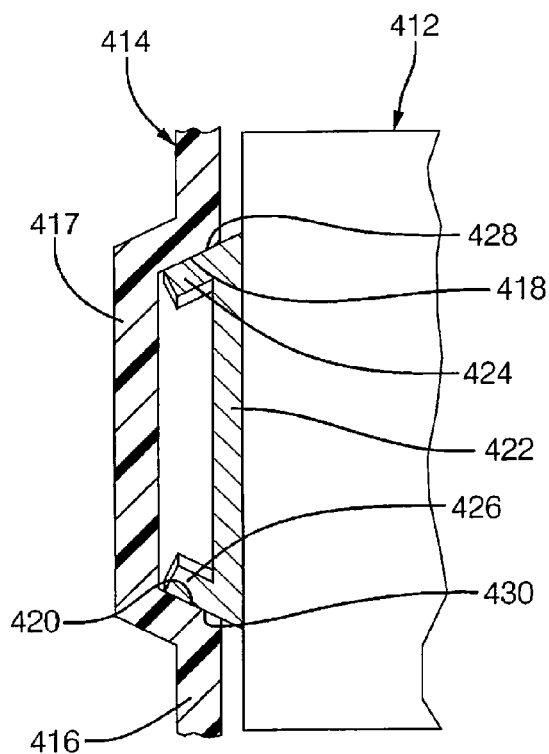
FIG. 30, is a cross-sectional view of an alternative configuration of the guideways/guide members of FIGS. 28 and 29, with the respective contacting surfaces angularly converging.
Figure 29:
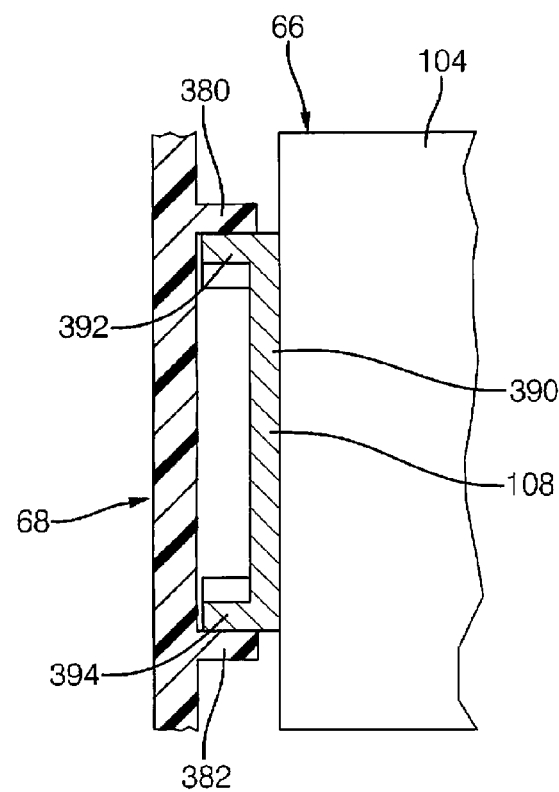
FIG. 29, is a cross-sectional view taken on lines 29-29 of FIG. 14, illustrating the juxtaposition of the associated pair of guideways and guide members with the bracket fully installed within the case.

Referring to FIG. 30, an alternative mounting configuration of an installed CD player subassembly 412 within a housing case 414 is illustrated. A sidewall 416 of the case 414 integrally defines a guideway 417 which extends laterally outwardly to form facing acutely offset cooperating upper and lower guide surfaces 418 and 420, respectively. Likewise, the CD player subassembly 412 carries left and right mounting brackets 422 (only one is illustrated) having acutely inwardly angled upper and lower legs 424 and 426, respectively, defining upper and lower surfaces 428 and 430, respectively.

Figure 31:
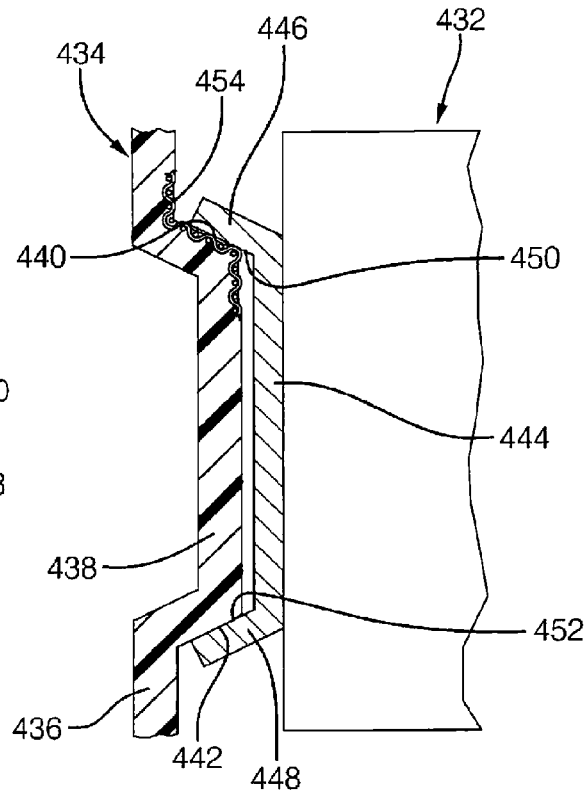
FIG. 31, is a cross-sectional view of a second alternative configuration of the guideways/guide members of FIGS. 28 and 29, with the respective contacting surfaces diverging and an electrical grounding connection established therebetween.
Figure 32:
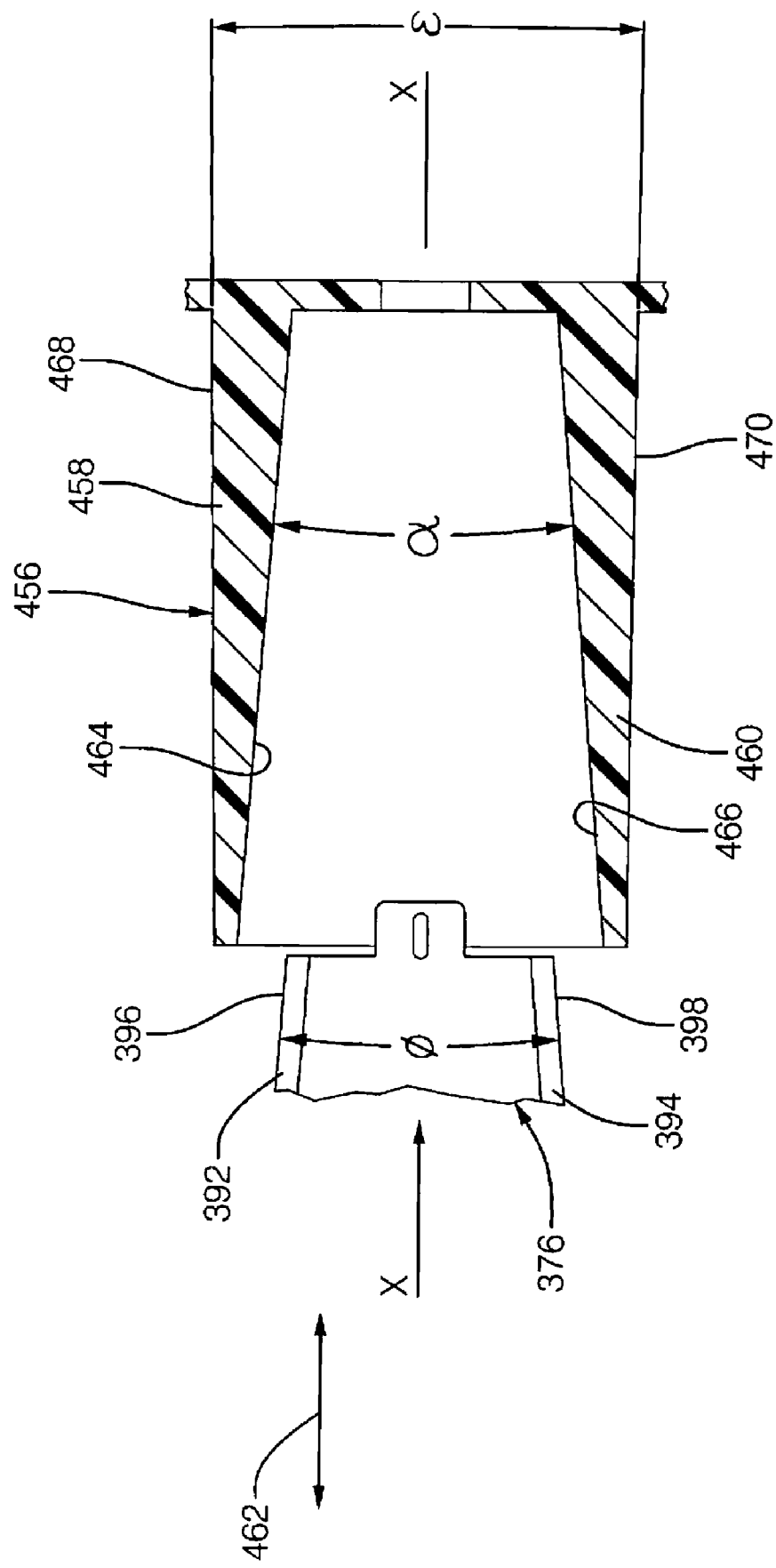
FIG. 32, is a fragmentary, cross-sectional view of the initial positioning of a CD mechanism bracket with respect to an alternative support shelf integrally formed within the case, similar to FIG. 12, with the wall surfaces defining the guideways each tapered on their upper and lower surfaces to provide a drafted condition to enhance injection molding formation of the case.

Referring to FIG. 31, an additional alternative mounting configuration of an installed CD player subassembly 432 within a housing case 434 is illustrated. A sidewall 436 of the case 434 integrally defines a guideway 438 which extends laterally inwardly to form opposed acutely offset cooperating upper and lower guide surfaces 440 and 442, respectively. Likewise, the CD player subassembly 432 carries left and right mounting brackets 444 (only one is illustrated) having acutely outwardly angled upper and lower legs 446 and 448, respectively, defining upper and lower surfaces 450 and 452, respectively.

A localized area of wire screen 454 can be formed in the guideway 438 to affect a ground path between the CD player subassembly 432 and the case 434.

Referring to FIG. 31, an alternative guideway 456 for the CD player mounting bracket 376 (refer FIGS. 12-14) has upper and lower leg portions 458 and 460, each having a tapered, increasing thickness in the vertical dimension along their longitudinal extent (along the assembly axis 462. Upper and lower guide surfaces 464 and 466, respectively, are offset by angle α. Outer guideway edge surfaces 468 and 470 have a slight reverse taper at an offset angle ε (approximately 1°-3°) to provide release draft for the injection molding process.

Molding in metal mesh into the plastic receiver case and front plate increases the strength of the material (much like putting re-bar into concrete) while still weighing less than a steel case. The gauge of the wire forming the mesh can be increased and the amount of plastic material can be substantially reduced, resulting in a very thin wall, robust structure.

Figure 19:
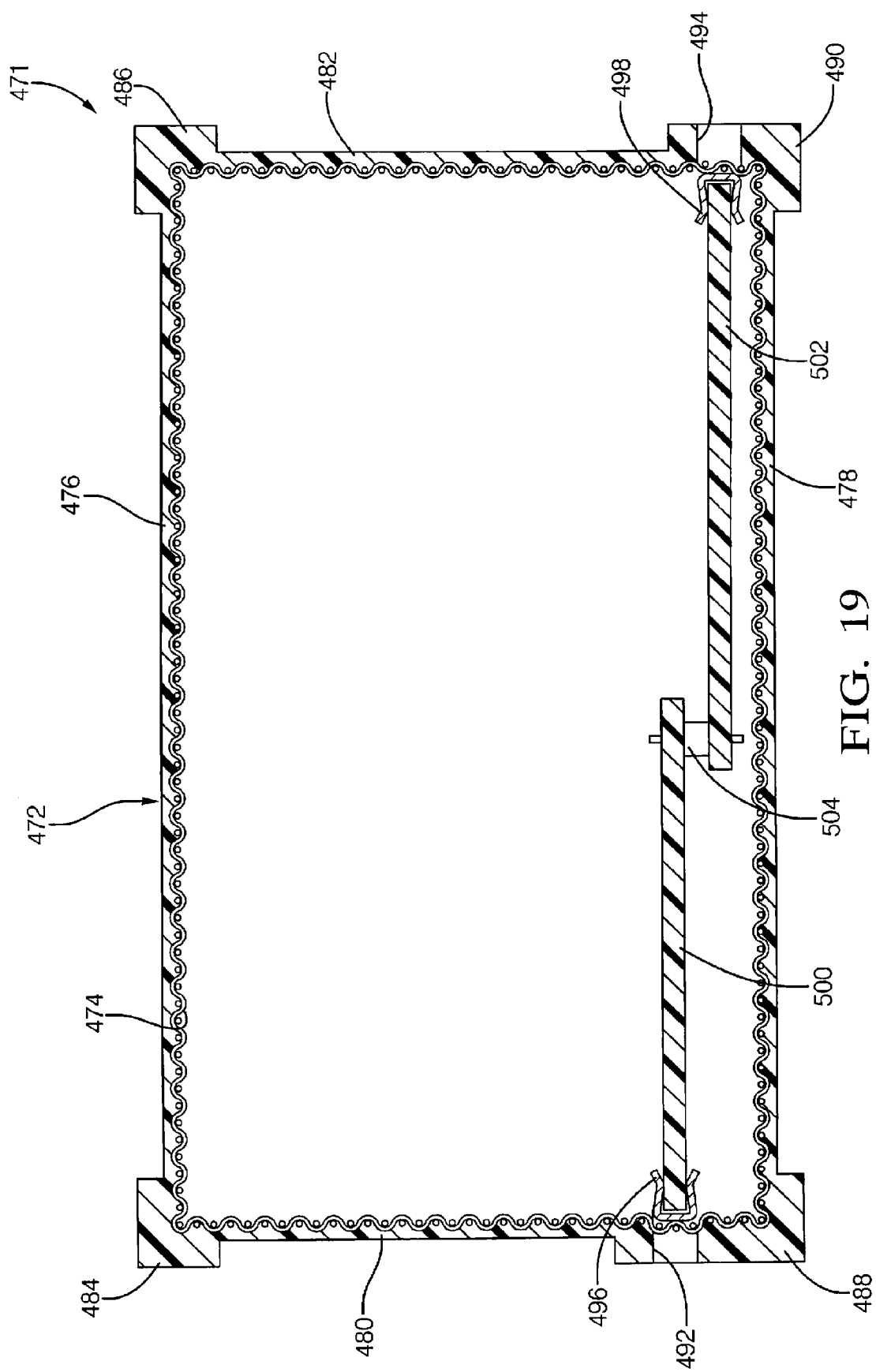
FIG. 19, is a cross-sectional view of an alternative, lighter weight outer case configuration in representative assembly with a bifurcated PC board wherein wire screen mesh provides both electromagnetic shielding as well as a significant portion of the overall structural strength of the case.

As an alternative to the structure illustrated in FIG. 19, the plastic can be eliminated from the center portions of some or all of the individual side, front, back, top and/or bottom panel portions of the case and front plate. This configuration would have the appearance of a screen box, with a molded plastic peripheral frame circumscribing each panel portion.

Referring to FIG. 19, a lightweight automotive audio system 471 can include a housing case 472 constructed of a composite of polymer based material with a wire screen 474 insert molded therein to isolate audio components therein from various electrical anomalies. To further reduce overall weight, the gauge of the wire screen can be increased whereby the screen contributes a significant component of the resulting overall structural strength of the case, while the nominal section or thickness of the polymer material can be substantially reduced. By way of example, the case 472 top and bottom wall portions 476 and 478, respectively, and left and right side wall portions 480 and 482, respectively, injection molded into a single unified structure, with the enlarged gauge wire screen 474 insert molded adjacent the inner surfaces thereof. Edges and corners of the case 472 formed at the intersection of two or three adjacent wall portions can be locally thickened to increase structural rigidity of the case 472 as well as to provide internal and external mounting and interface ports. The intersecting edges of the top wall portion 476 and the left and right side wall portions 480 and 482, respectively, form thickened left and right upper edge frames 484 and 486, respectively. Likewise, the intersecting edges of the bottom wall portion 478 and the left and right side wall portions 480 and 482, respectively, form thickened left and right lower edge frames. Lower edge frames 488 and 490 are locally vertically extended openings 492 and 494 for exposing the wire screen 474 to establish electrical contact with contact clips 496 and 498 carried by PCBs 500 and 502, respectively, interconnected by pin connectors 504 within the case 472.

The example embodiment of FIG. 19 can be further modified to form an extremely lightweight case 506 constructed of polymer based material and wire screen 508. Case 506 is configured so that some or all of the wall portions comprise a polymer frame 510 about the perimeter thereof and the wire screen 508 closing the center portion of such wall portions. Portions of the wire screen 508 adjacent edges of the case 506 are affixed to the frame 510 such as by insert molding. Attachment features such as mounting flanges 512, tab receiving extensions 514, ramped snap-engagement features 516 can be molded as an integral portion of the frame 510. Ports, such as wiring harness interconnections 518 and 520, and coaxial cable antenna interconnections 522 can be easily molded within an extended frame portion 524. Windows 526 and 528 can also be formed in extended frame portion 524 for electrically interconnecting the wire screen 508 with internal components.

Using plastic for a receiver case enables low cost assembly of the components. The circuit boards and the CD mechanism can slide into place and then be locked or they can be snapped into place without screws. This reduces the number of parts required in the assembly and reduces the amount of direct and indirect labor to put a receiver together. The plastic case can be easily molded into a net shape forming the slides and snaps needed for assembly.

Referring to FIGS. 2-5, the apparatus and assembly method described substantially reduces the labor and component cost of the radio/CD player 62, as well as the required capital costs. Furthermore, it substantially enhances product quality by substantially eliminating the possibility of extraneous or missing (small) parts and/or improper assembly.

Using the molded in metal mesh in the receiver plastic box that is grounded to the circuit boards creates a Faraday cage that provides shielding protection for RFI (Radio Frequency Interference), EMI (Electro Magnetic Interference), BCI (Bulk Current Injection), and ESD (Electrostatic Discharge).

Referring to FIGS. 33-49, the electrically conductive material insert molded within the polymer based material to form the case of an electrical device is embossed through the formation of one or more elongated upset beads within exposed regions (windows) of the case. This establishes a localized resiliently displaceable portion of the case to facilitate its fastenerless assembly and/or interaction with the host vehicle. The exposed conductive material is, in assembly, in intimate contact with subassemblies, such as a CD player mounting bracket within the case and establishes a robust electrical ground path therebetween. The upset bead ensures localized flexibility of portions of the case, preventing rupture of the conductive material and possible leakage of electrical anomalies.

Preferably, an extension of polymer based material forms a cantilever tab or island within the window which is resiliently displaceable during the assembly process. The tab forms a self engaging feature which engages a mating projection extending from the mounting bracket of the subassembly to retain the subassembly in its design intent location.

The embodiments of the invention described in connection with FIGS. 33-49 correspond in most respects with the embodiments previously described in connection with FIGS. 12-18, 28, 29 and 32, with the exception of specifics set forth hereinbelow.

Figure 33:
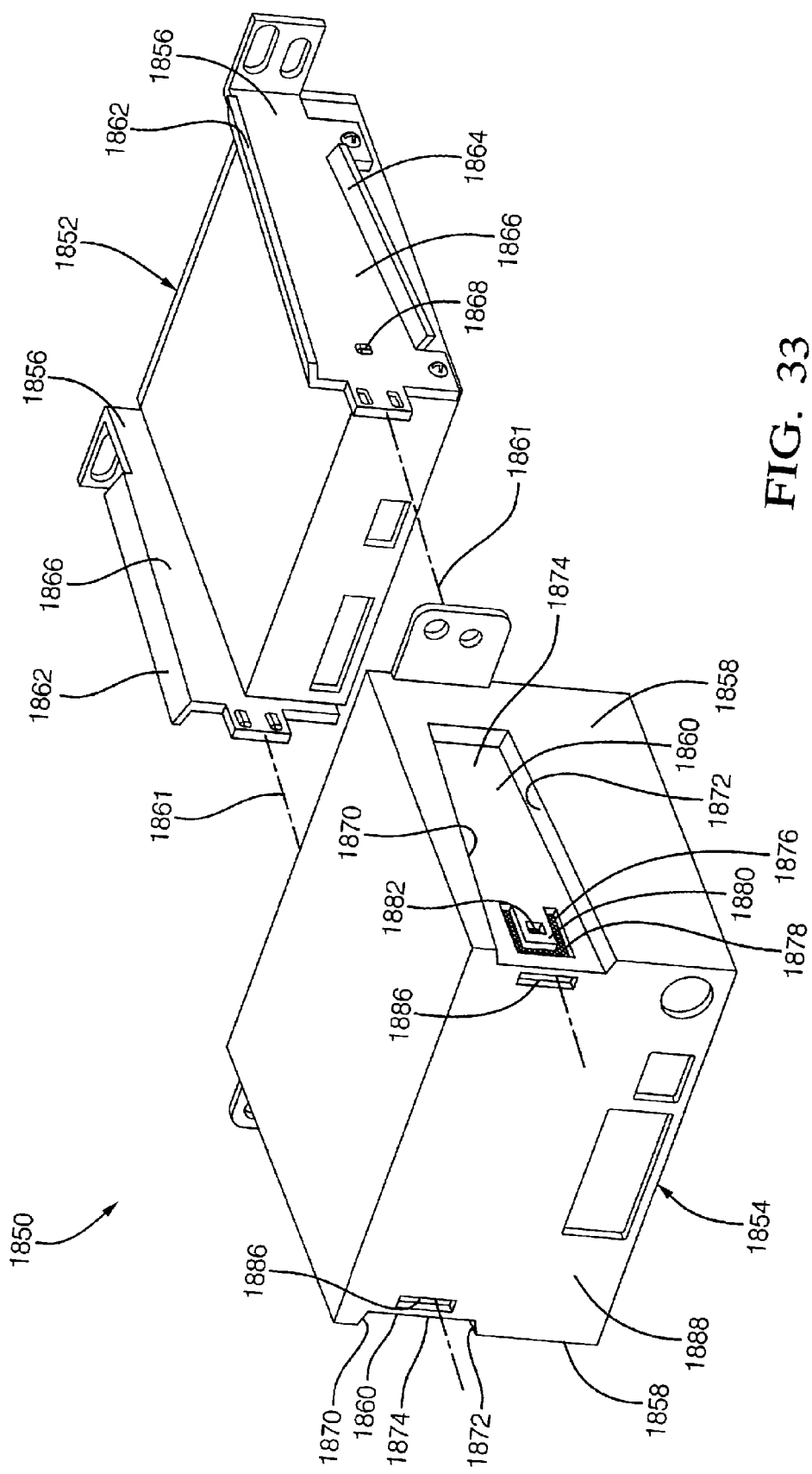
FIG. 33, is an exploded, left-rear perspective view of another feature of the present invention embodied in a lightweight electronic device configured for automotive applications featuring selectively embossed segments of exposed composite case electrical shielding material operative to enhance screwless assembly of subassembly brackets within (or exterior of) the case.

Referring to FIG. 33, an exploded, left-rear perspective view of a lightweight electronic device 1850 configured for automotive applications is illustrated, including an electronic circuit component such as a CD changer 1852 and a housing assembly 1854 featuring selectively embossed segments of exposed composite case electrical shielding material operative to enhance screwless assembly of subassembly brackets 1856 within (or exteriorly of) the case. Definitionally, subassembly brackets 1856 constitute adjacent structural elements. As described hereinabove, the housing case 1854 is constructed as a composite of relatively rigid polymer based material and electrically conductive material such as wire screen insert molded therein. Case walls including the electrically conductive material substantially enclose and shield the electronic circuit component from electrical anomalies.

Opposed sidewalls 1858 form symmetrical guideways 1860 for receiving and guiding the brackets 1856 (and CD changer 1853) along assembly axes 1861. Each bracket 1856 forms laterally diverging upper and lower legs 1862 and 1866, respectively, which are separated by a vertical wall portion 1866. The brackets 1856 are formed of electrically conductive material which is in-circuit with the CD changer 1852. Each bracket 1856 has an engagement feature or "bump" 1868 integrally formed therewith which extends laterally outwardly from the wall portion 1866 at a point vertically intermediate the upper and lower legs, 1862 and 1864, respectively.

Each guideway 1860 forms laterally diverging upper and lower wall portions 1870 and 1872, respectively, interconnecting a vertical wall portion 1874 to its respective sidewall 1858. A window 1876 is formed in vertical wall portion 1874 of guideway 1860, the window 1876 extending entirely or substantially through the polymer material forming the sidewall 1858 and exposing a portion of wire screen 1878. A peninsular extension or tab 1880 is integrally formed with vertical wall portion 1874 and extends as a cantilever into the window 1876. A recess or opening 1882 is formed adjacent the free end of the tab 1880. As best viewed in FIG. 33, as thus constructed, the portion of the window 1876 not closed by the tab 1880, i.e. that portion closed only by the wire screen 1878, forms a general "C" configuration, with a base portion of the "C" disposed adjacent the free end of the cantilever tab 1880 and upper and lower parallel leg portions of the "C" extending continuously from the free end of the tab 1880 to its point of attachment with the adjacent vertical wall portion 1874 of the guideway 1860.

Referring to FIGS. 34 and 35, a broken, overhead sectional view of the case 1854 and leading ends of the two brackets 1856 are illustrated with the elements juxtaposed similarly to that of FIG. 171 wherein the CD charger 1852 and its attendant brackets 1856 are aligned along the assembly axes 1861 prior to contact between the brackets 1856 and case 1854.

Referring to FIGS. 36 and 37, as the two brackets 1856 (and CD changer 1852) are inserted within the case 1854 along the assembly axes 1861, the bracket bumps 1868 initially slidingly contact their respective inner surfaces of vertical wall portions 1874 of guideways 1860. Advancement of the brackets 1856 along the assembly axes 1861 will cause the free ends of the brackets 1856 to resiliently deflect laterally inwardly as depicted by arrow 1885.

Referring to FIGS. 38 and 39, as the two brackets further advance along the assembly axes 1861, the bracket bumps 1868 slide along the inner surface of each tab 1880, deflecting them outwardly. Simultaneously, the leading ends 1884 of the brackets 1856 register with and extend rearwardly outwardly through associated openings 1886 in the rear wall 1888 of the case 1854 to laterally secure the leading end 1884 of the brackets. When the leading ends 1884 of the brackets 1856 are engaged within their respective openings 1886, the overall structure of the brackets 1856 is effectively stiffened and substantially preventing further inward lateral displacement as depicted by arrow 1885. Thus, the interference fit of the bumps 1868 with the vertical wall portion 1874 results in a maximum outward lateral displacement of the free ends of the tabs 1880. The leading ends 1884 of the brackets 1856 each have a localized upset bead or rib that is dimensioned for interference fit with openings 1886 to provide redundant interlocking engagement of the bracket 1856 with the back wall 1883 of the case 1854 similar to the embodiment of the invention described hereinabove in connection with FIGS. 12-18.

Referring to FIGS. 40-41, as the brackets 1856 (and CD changer 1852) are longitudinally inserted into their design intent positions, the bumps 1868 register with their respective openings 1882 within their tabs 1880, resulting in the tabs 1880 resiliently relaxing and returning to their original orientation with respect to the vertical wall portions 1874 as depicted in FIGS. 34-37. Thus disposed, the rearwardly facing edge 1890 of each tab opening 1882 engages the forwardly facing edge 1892 of the respective bump 1868 to releasably interlock the brackets 1856 within the case 1854 without the use of separate components such as threaded fasteners.

Figure 42:
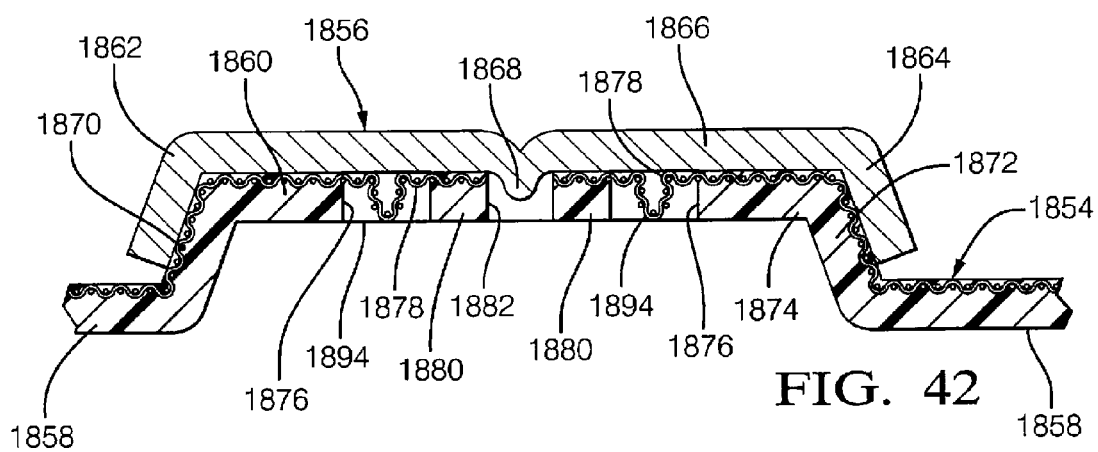
FIG. 42, is a fragmentary, cross-sectional view of the fully assembled automotive electronic device and subassembly mounting bracket of FIG. 33 on an enlarged scale, taken on line 42-42 of FIG. 41.

As best seen in FIG. 42, the electrically conductive wire screen 1878 is exposed at selected locations of the inner surface of the case sidewalls 1858. In particular, the inner surfaces of the wall portions 1870, 1872 and 1874 of the guideways 1860 expose the wire screen 1878 to ensure intimate contact with the brackets 1856 and thereby establish a reliable electrically conductive path therebetween. Preferably, a section of wire mesh 1878 corresponding with the tab openings 1882, is removed to ensure full penetration of the bracket bump 1868 within each opening 1882.

For the most part, the wire screen 1878 is formed in planer segments corresponding with the case walls. Portions of the wire screen 1878 exposed within openings formed by the windows 1876 are embossed, meaning that they have at least one laterally inwardly and/or outwardly extending upset bead 1894 formed therein which is elongated to enable localized flexure of the wire screen 1878 during cantilever flexure of the tab 1880 during insertion of the brackets 1856. Preferably, the line of elongation of the upset bead 1894 extends parallel to and spaced from the edges of the rigid polymer material delimiting the window opening and is disposed intermediate the window edges and the cantilever portion of the tab 1880. As best seen in FIG. 39, the upset bead 1894 is momentarily distended during the final stages of insertion of the brackets 1856 and, as best seen in FIG. 41, returns to its original configuration upon completion of the assembly process. Referring to FIGS. 33, 41 and 42, the upset bead 1894, in this embodiment of the invention, mimics the open wire screen 1878 configuration, extending continuously vertically along the base of the "C" wire screen configuration and longitudinally forwardly along the entire length of the legs of the "C" wire screen configuration.

Although subject to variations depending upon specific design requirements, the degree of upset of the bead 1894 is preferably approximately equal to the nominal thickness of the adjacent rigid polymer based material.

Figure 43:
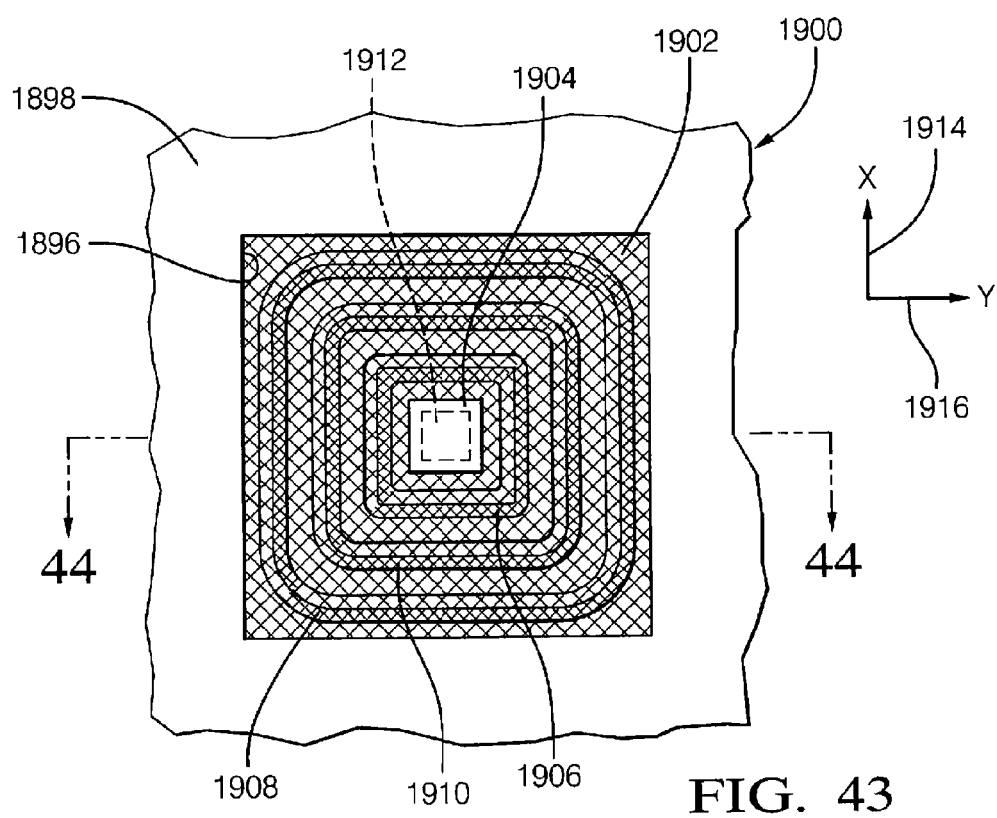
FIG. 43, is a fragmentary plan view of a portion of a composite case wall illustrating a window opening in the polymer based material exposing conductive material (conductive screen mesh) with multiple concentric upset beads formed therein circumscribing a discrete segment of polymer based material (island)
Figure 44:
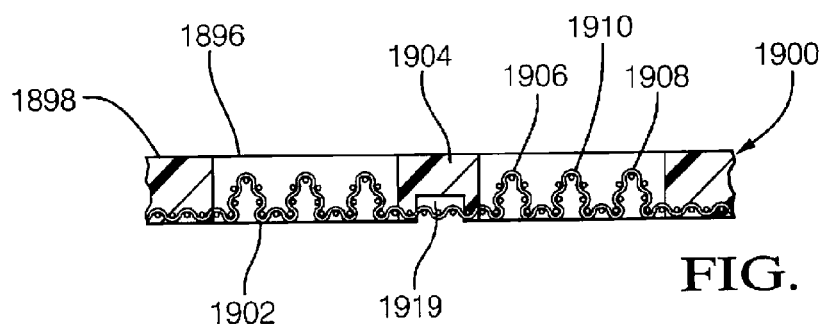
FIG. 44, is a fragmentary, cross-sectional view of the case window opening, taken on line 44-44 of FIG. 43.

Referring to FIGS. 43 and 44, an alternative design of the present invention is illustrated. A window 1896 formed in a wall 1898 of a case 1900 exposing a segment of wire screen 1902. A discrete or "floating" island 1904 is insert molded with a central portion of the wire screen 1902 but is spaced from the wall 1898. The wire screen 1902 is embossed with three concentric continuous upset beads, an inner bead 1906, an outer bead 1908 and an intermediate bead 1910. The upset beads 1906, 1908 and 1910 are spaced to function as a diaphragm for maximum momentary distension during the assembly process. The island 1904 has a recess 1912 formed in the inner surface thereof for engaging an electronic circuit component (not illustrated). Each of the upset beads 1906, 1908 and 1910 extend circumferentially continuously about the island 1094 to effect substantially symmetrical distension characteristics in both the "X" and "Y" axes designated by arrows 1914 and 1916.

Figure 45:
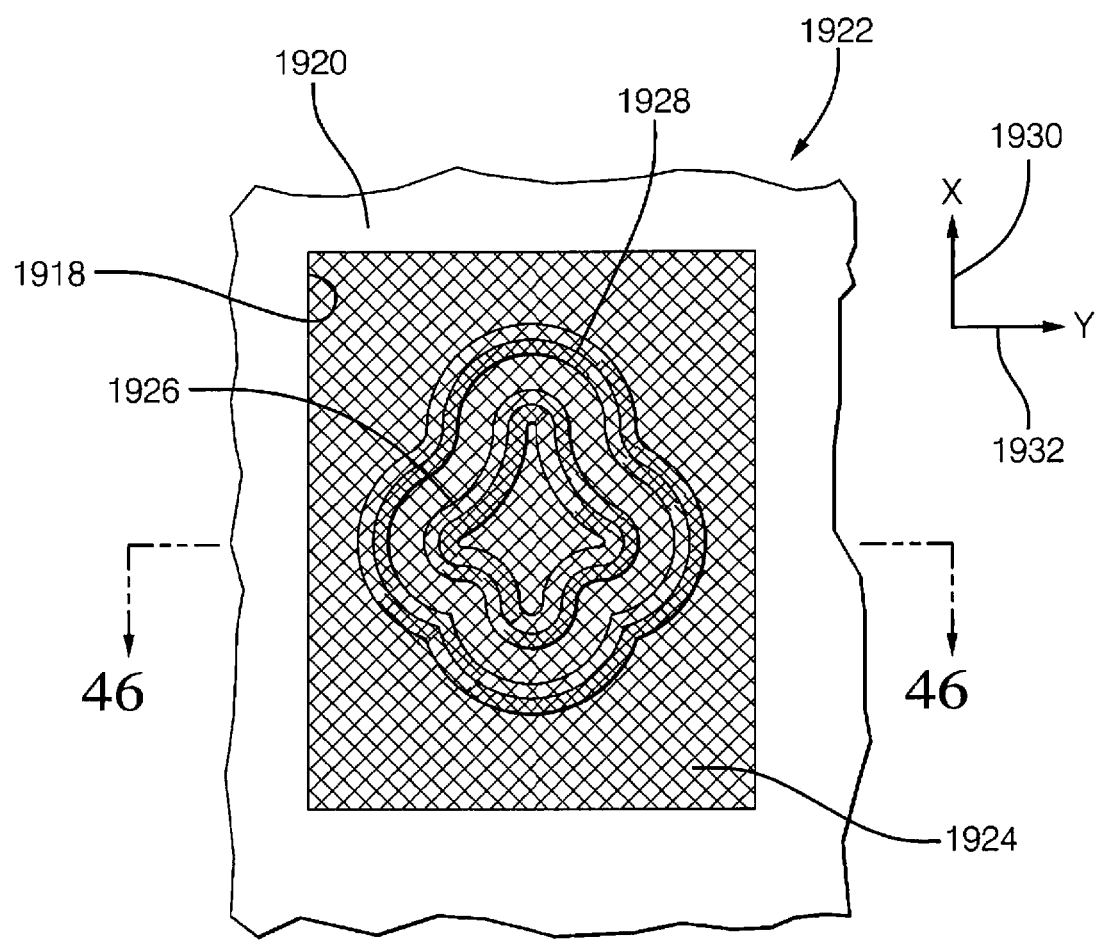
FIG. 45, is a fragmentary plan view of a portion of a composite case wall illustrating a window opening in the polymer based material exposing conductive material (conductive screen mesh) with multiple concentric upset beads formed therein similar to FIG. 43, but lacking a discrete segment of polymer based material (island)
Figure 46:
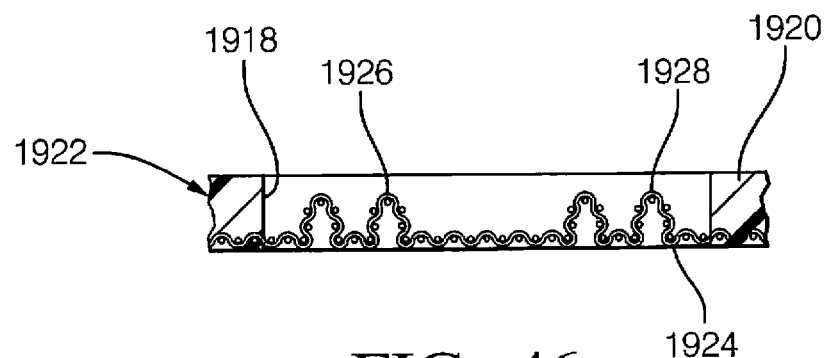
FIG. 46, is a fragmentary, cross-sectional view of the case window opening, taken on line 46-46 of FIG. 45.

Referring to FIGS. 45 and 46, a second alternative design of the present invention is illustrated. A window 1918 formed in a wall 1920 of a case 1922 exposing a segment of wire screen 1924. A discrete or "floating" island (not illustrated) such as that described in connection with the embodiment of FIGS. 43 and 44 can also be insert molded with a central portion of the wire screen 1924 which is spaced from the wall 1920. The wire screen 1924 is embossed with two concentric continuous upset beads, an inner bead 1926 and an outer bead 1928. The upset beads 1926 and 1928 are spaced to function as a diaphragm for maximum momentary distension during the assembly process. Each of the upset beads 1926 and 1928 extend circumferentially continuously, but are circumferentially irregular to affect asymmetrical distension characteristics in the "X" and "Y" axes designated by arrows 1930 and 1932, as well as to provide a decorative motif or distinguishing design.

Figure 47:
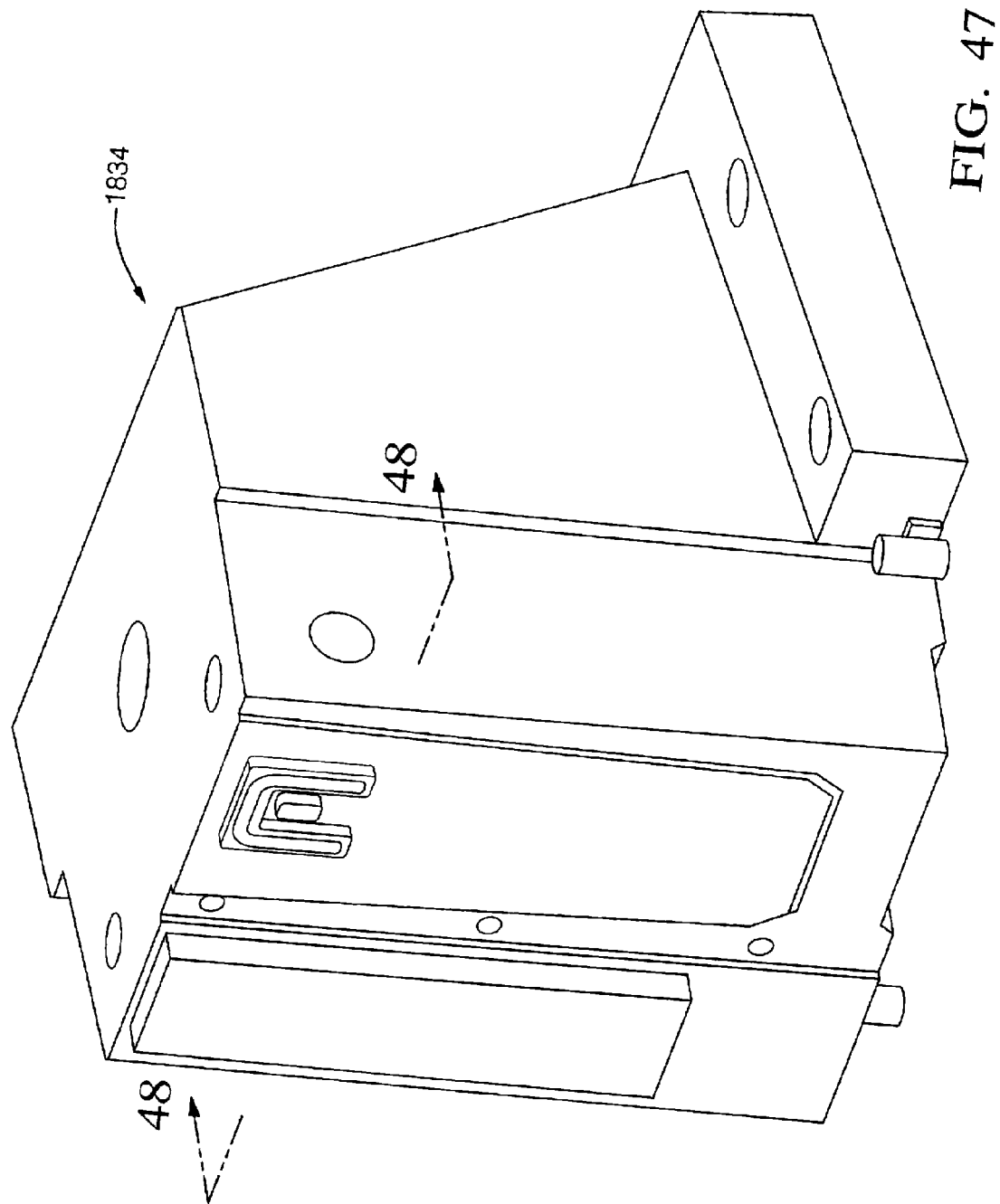
FIG. 47, is a perspective view of a solid model of a male die portion of a die set configured to affect formation of the composite electronic device case of FIG. 33, illustrating the detail of the region of the die portion which establishes the case side window and affects formation of the conductive material upset bead upon closure with a mating die portion (not illustrated)
Figure 48:
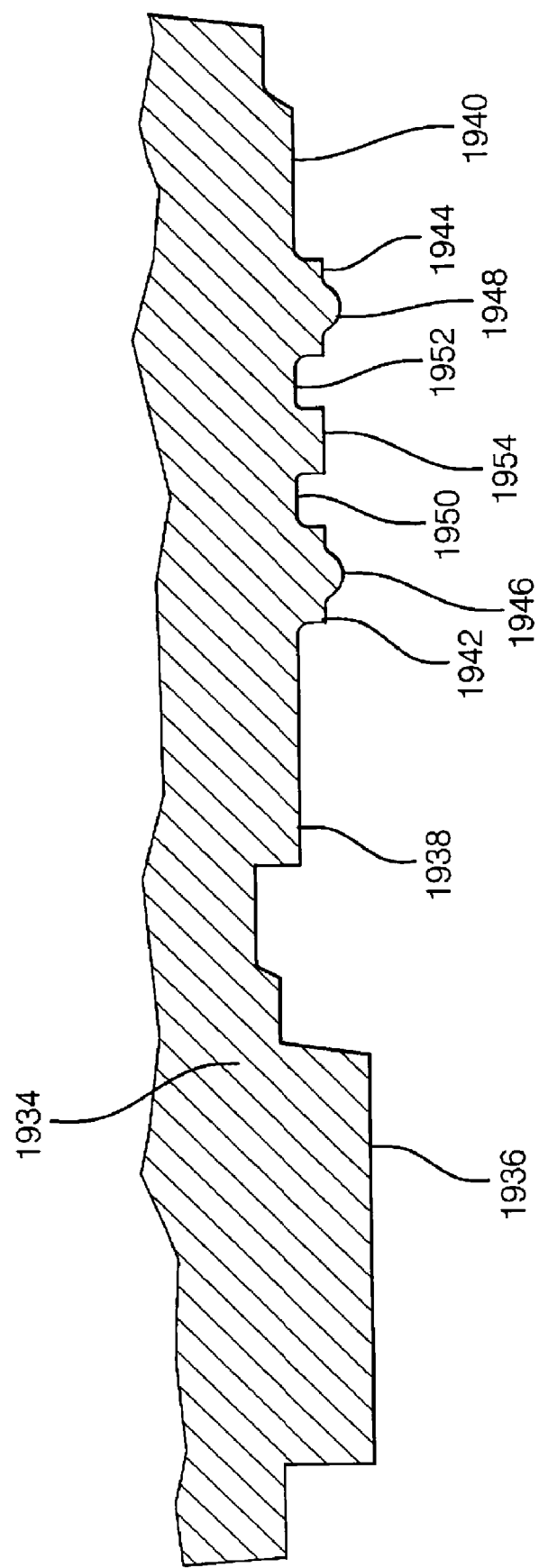
FIG. 48, is a exemplary dimensioned profile of the male die portion of FIG. 47 through its region which forms the case window.

Referring to FIGS. 47 and 48, a detailed exemplary solid model of a male die portion 1934 of a die set configured to affect formation of the composite electronic device case 1854 of FIG. 33, illustrating the detail of the region of the die portion 1934 which establishes the case side window 1876 and affects formation of the conductive material upset bead 1894 upon closure with a mating die portion (not illustrated). FIG. 48 depicts an exemplary dimensioned profile of the male die portion 1934 of FIG. 47 through its region which forms the case window 1876. Male die portion 1934 has an external surface 1936 taken along section line 48-48 of FIG. 47 defining details 1938 and 1940 for forming the inner surface of a case sidewall 1858, details 1942 and 1944 for forming opposed legs of the case window 1876, details 1946 and 1948 for forming opposed portions of the screen upset bead 1894, details 1950 and 1952 for forming the integral tab 1880 within the window 1876, and a detail 1954 for forming the tab recess/opening 1882.

FIG. 49 depicts a Product Data Sheet of steel mesh employed by the applicant in certain embodiments of the composite case of the present invention.

It is to be understood that the invention has been described with reference to specific embodiments and variations to provide the features and advantages previously described and that the embodiments are susceptible of modification as will be apparent to those skilled in the art.

Furthermore, it is contemplated that many alternative, common inexpensive materials can be employed to construct the basis constituent components. Accordingly, the forgoing is not to be construed in a limiting sense.

The invention has been described in an illustrative manner, and it is to be understood that the terminology, which has been used is intended to be in the nature of words of description rather than of limitation.

Obviously, many modifications and variations of the present invention are possible in light of the above teachings. For example, a number of the various radio/CD player case constructions illustrated herein are illustrated as being formed of solid molded polymer material for the sake of simplicity and clarity of understanding. It is to be understood, however, that the wire mesh depicted, for example in FIG. 20, can be employed in the other configurations and embodiments with equal success. Furthermore, several of the housing assembly structures are described herein as being formed of metal. However, a wide range of material substitutes, including plastics, ceramics, non-ferrous metals and composites can be substituted without departing from the spirit and scope of the present invention. The terms "snap-engaging" and "self-engaging" are intended to interpreted very broadly inasmuch as innumerable structural, process (e.g. weldments) and chemical (e.g. adhesives) equivalents are available. It is, therefore, to be understood that within the scope of the appended claims, wherein reference numerals are merely for illustrative purposes and convenience and are not in any way limiting, the invention, which is defined by the following claims as interpreted according to the principles of patent law, including the Doctrine of Equivalents, may be practiced otherwise than is specifically described.

What is claimed:
1. A lightweight automotive electronic device comprising:
at least one electronic circuit component; and
a housing assembly substantially formed of a composite of relatively rigid polymer based material and electrically conductive material operable to substantially enclose and to shield said at least one electronic circuit component from electrical anomalies including RFI (radio frequency interference), EMI (electromagnetic interference), BCI (bulk current injection) and/or ESD (electrostatic discharge), wherein said housing assembly includes at least one window formed therein, said window substantially closed by an embossed segment of said conductive material operative to effect electrical interconnection between said conductive material and said at least one electronic circuit component, and wherein said conductive material is insert molded within said polymer based material.

2. The electronic device of claim 1, wherein said housing assembly comprises:
   a generally box-like case having integrally formed wall portions and an opening for receiving said electronic component; and
   a closure member cooperating with the case to enclose electronic system subassemblies within a cavity defined by said housing assembly.

3. The electronic device of claim 2, wherein said window is formed in one of said wall portions.

4. The electronic device of claim 1, wherein said conductive material comprises open mesh wire screen, wherein said window is operative to enable the flow of ambient fluid therethrough.

5. The electronic device of claim 1, wherein said embossed portion of conductive material defines an elongated upset bead.

6. The electronic device of claim 5, wherein said upset bead projects outwardly.

7. The electronic device of claim 5, wherein said upset bead projects inwardly.

8. The electronic device of claim 5, wherein said upset bead projects both inwardly and outwardly.

9. The electronic device of claim 5, wherein said upset bead extends peripherally adjacent edges of said window.

10. The electronic device of claim 9, wherein said upset bead extends peripherally substantially about the entire circumference of said window.

11. The electronic device of claim 5, wherein the embossed portion of said conductive material comprises a plurality of generally concentric elongated upset beads.

12. The electronic device of claim 1, further comprising a segment of rigid polymer based material resiliently carried within said window for limited displacement with respect to said housing assembly.

13. The electronic device of claim 12, wherein said segment of rigid polymer based material is discrete and separated from the polymer based material forming an adjacent wall portion of said housing assembly.

14. The electronic device of claim 12, wherein said segment of rigid polymer based material comprises a cantilevered extension of the polymer based material forming an adjacent wall portion of said housing assembly.

15. A lightweight automotive electronic device comprising:
   at least one electronic circuit component; and
   a housing assembly substantially formed of a composite of relatively rigid polymer based material and electrically conductive material operable to substantially enclose and to shield said at least one electronic circuit component from electrical anomalies including RFI (radio frequency interference), EMI (electromagnetic interference), BCI (bulk current injection) and/or ESD (electrostatic discharge),
   wherein said housing assembly includes at least one window formed therein, said window substantially closed by an embossed segment of said conductive material operative to effect electrical interconnection between said conductive material and said at least one electronic circuit component, and
   wherein said conductive material is disposed substantially adjacent inner surfaces of said housing assembly.

16. A lightweight automotive electronic device comprising:
   at least one electronic circuit component; and
   a housing assembly substantially formed of a composite of relatively rigid polymer based material and electrically conductive material operable to substantially enclose and to shield said at least one electronic circuit component from electrical anomalies including RFI (radio frequency interference), EMI (electromagnetic interference), BCI (bulk current injection) and/or ESD (electrostatic discharge),
   wherein said housing assembly includes at least one window formed therein, said window substantially closed by an embossed segment of said conductive material operative to effect electrical interconnection between said conductive material and said at least one electronic circuit component,
   said electronic device further comprising a segment of rigid polymer based material resiliently carried within said window for limited displacement with respect to said housing assembly,
   wherein said segment of polymer based material is integrally formed with said embossed segment of conductive material.

17. A lightweight automotive electronic device comprising: at least one electronic circuit component; and a housing assembly substantially formed of a composite of relatively rigid polymer based material and electrically conductive material operable to substantially enclose and to shield said at least one electronic circuit component from electrical anomalies including RFI (radio frequency interference), EMI (electromagnetic interference), BCI (bulk current injection) and/or ESD (electrostatic discharge),
   wherein said housing assembly includes at least one window formed therein, said window substantially closed by an embossed segment of said conductive material operative to effect electrical interconnection between said conductive material and said at least one electronic circuit component,
   said electronic device further comprising a segment of rigid polymer based material resiliently carried within said window for limited displacement with respect to said housing assembly,
   wherein said segment of polymer based material defines an engagement surface for limiting displacement of an adjacent structural element.

18. The electronic device of claim 17, wherein said adjacent structural element comprises an electronic subassembly mounting bracket disposed within said housing assembly.

19. The electronic device of claim 17, wherein said adjacent structural element comprises a device disposed externally of said housing assembly.

* * * * *